(12) United States Patent
Shinozaki et al.

(10) Patent No.: US 8,064,264 B2
(45) Date of Patent: Nov. 22, 2011

(54) ORNAND FLASH MEMORY AND METHOD FOR CONTROLLING THE SAME

(75) Inventors: Naoharu Shinozaki, Kanagawa (JP); Masao Taguchi, Kanagawa (JP); Akira Ogawa, Kanagawa (JP); Takuo Ito, Kanagawa (JP)

(73) Assignee: Spansion LLC, Sunnyvale, CA (US)

( * ) Notice: Subject to any disclaimer, the term of this patent is extended or adjusted under 35 U.S.C. 154(b) by 1076 days.

(21) Appl. No.: 11/974,295

(22) Filed: Oct. 11, 2007

(65) Prior Publication Data

US 2008/0098165 A1 Apr. 24, 2008

(30) Foreign Application Priority Data

Oct. 13, 2006 (JP) .................................. 2006-279418

(51) Int. Cl.
*G11C 16/06* (2006.01)

(52) U.S. Cl. ......... 365/185.22; 365/185.21; 365/185.18; 365/185.33

(58) Field of Classification Search ........... 365/185.21–185.23, 185.18, 185.12, 365/185.33, 189.158; 711/118, 168
See application file for complete search history.

(56) References Cited

U.S. PATENT DOCUMENTS

| 5,481,671 | A | 1/1996 | Fujisaki | |
|---|---|---|---|---|
| 6,421,279 | B1 * | 7/2002 | Tobita et al. | ........... 365/189.011 |
| 6,469,955 | B1 | 10/2002 | Tsao et al. | |
| 7,123,521 | B1 * | 10/2006 | Louie et al. | .............. 365/189.05 |
| 7,546,416 | B2 * | 6/2009 | Yip | ............................... 711/118 |
| 2003/0076719 | A1 | 4/2003 | Byeon et al. | |

* cited by examiner

*Primary Examiner* — David Lam

(57) ABSTRACT

A semiconductor device that includes: a memory cell array that includes non-volatile memory cells; an area that is contained in the memory cell array and stores area data; a first storage unit that holds data transferred from the memory cell array, and outputs the data; and a control circuit that selects between a primary reading mode for causing the first storage unit to hold the area data transferred from the memory cell array and to output the area data, and a secondary reading mode for causing the first storage unit to hold a plurality of pieces of divisional data formed by dividing the area data and transferred from the memory cell array and to output the divisional data.

24 Claims, 28 Drawing Sheets

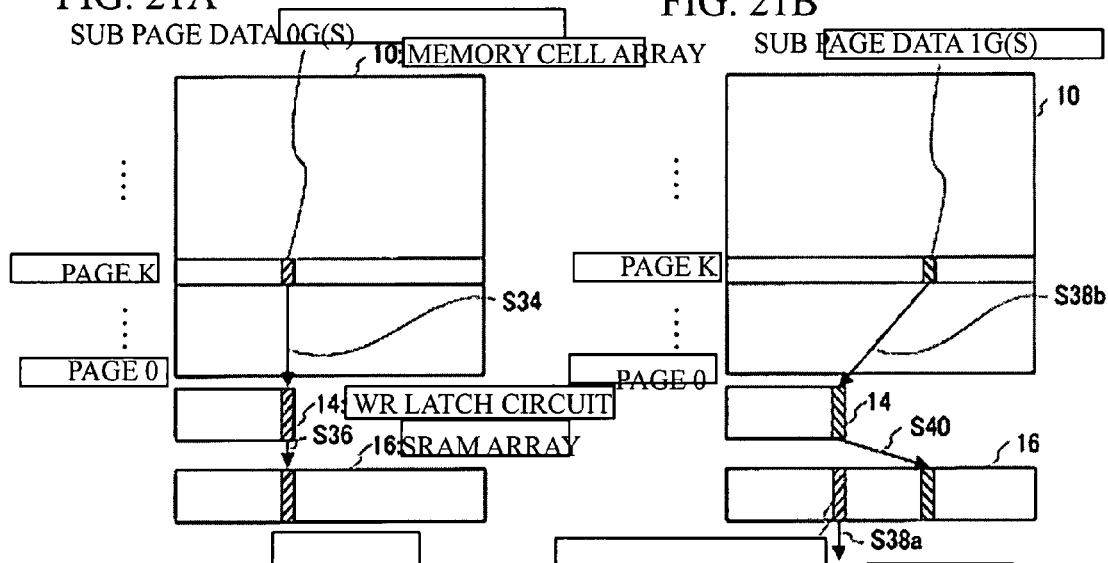
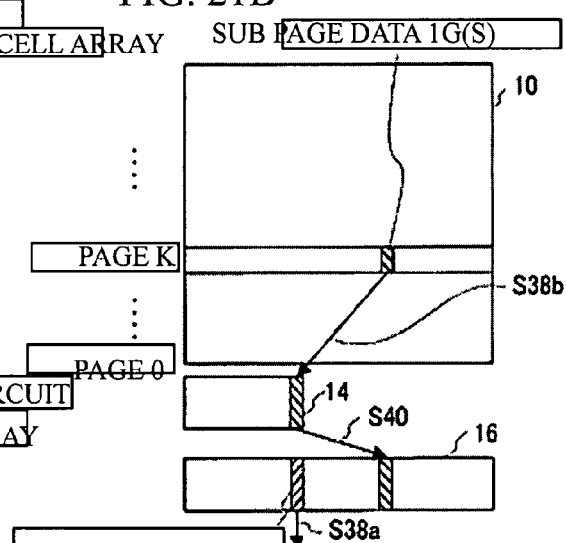
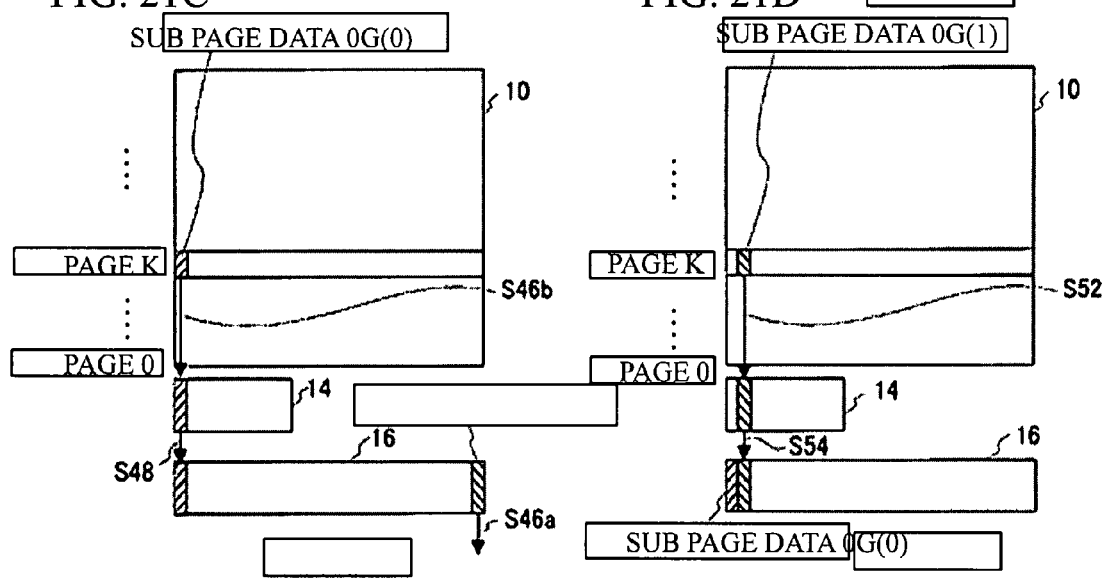
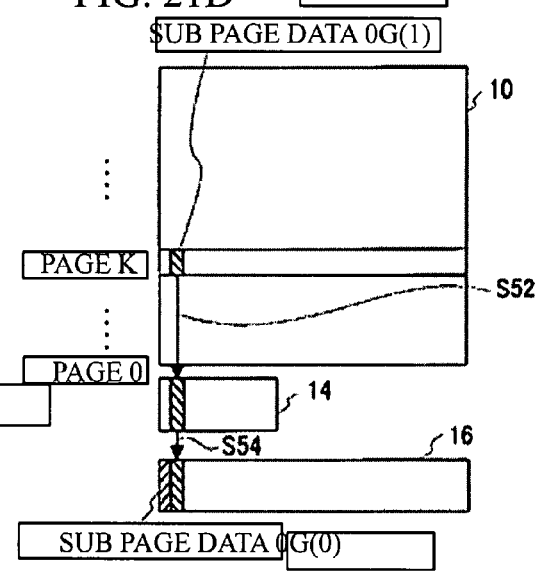
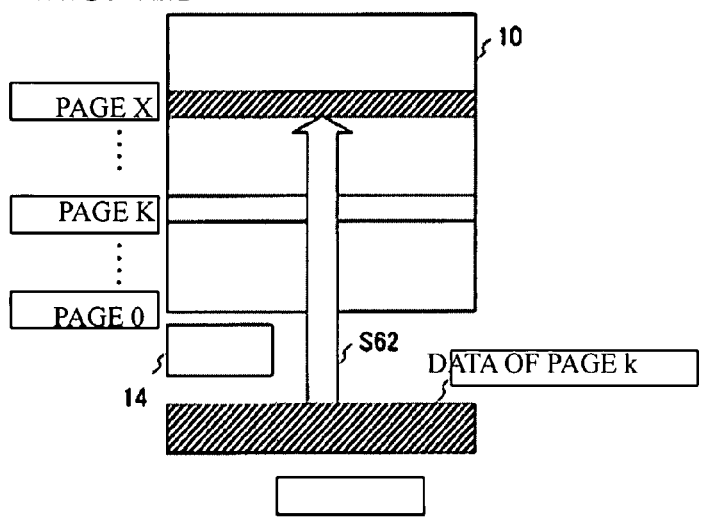

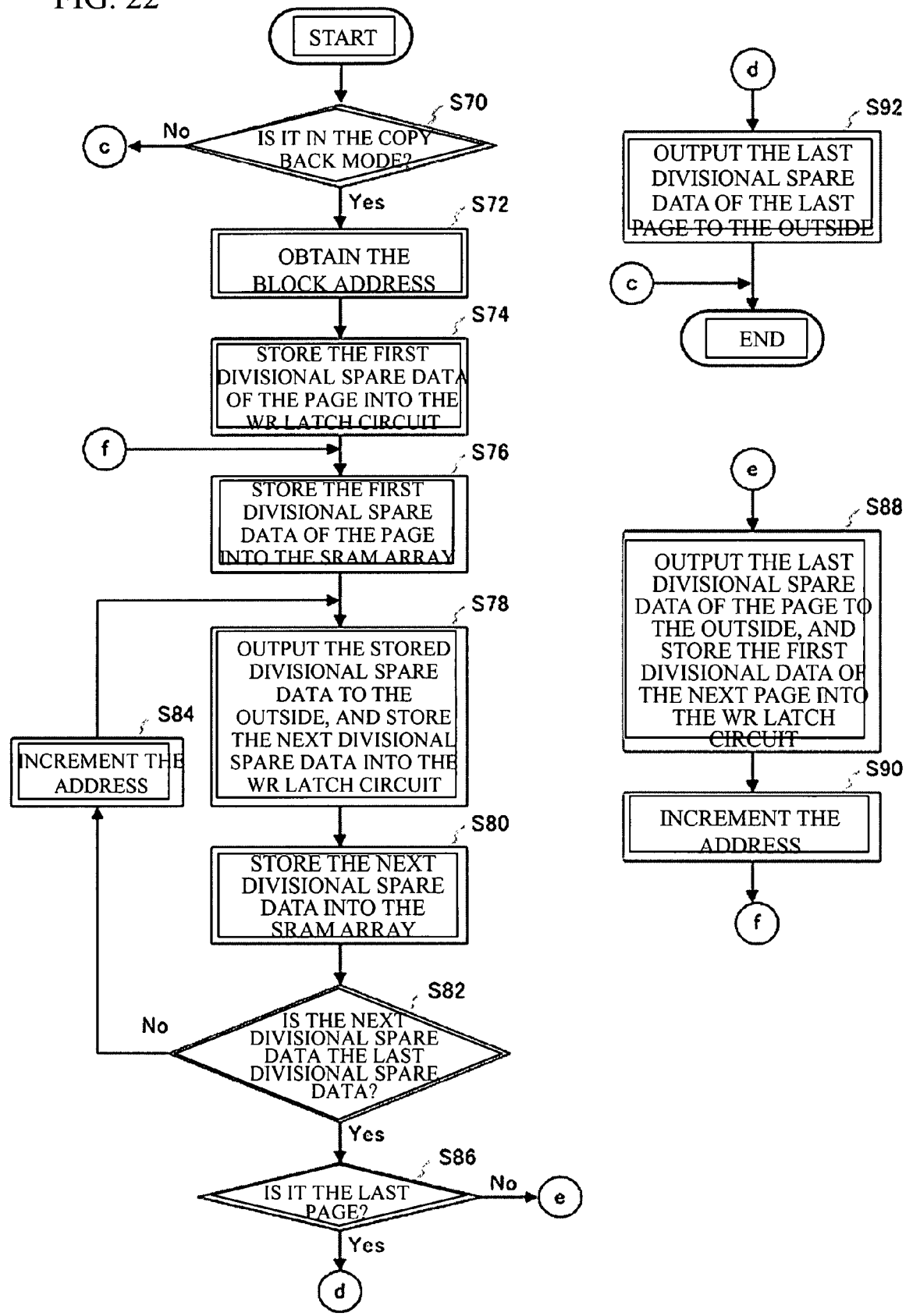

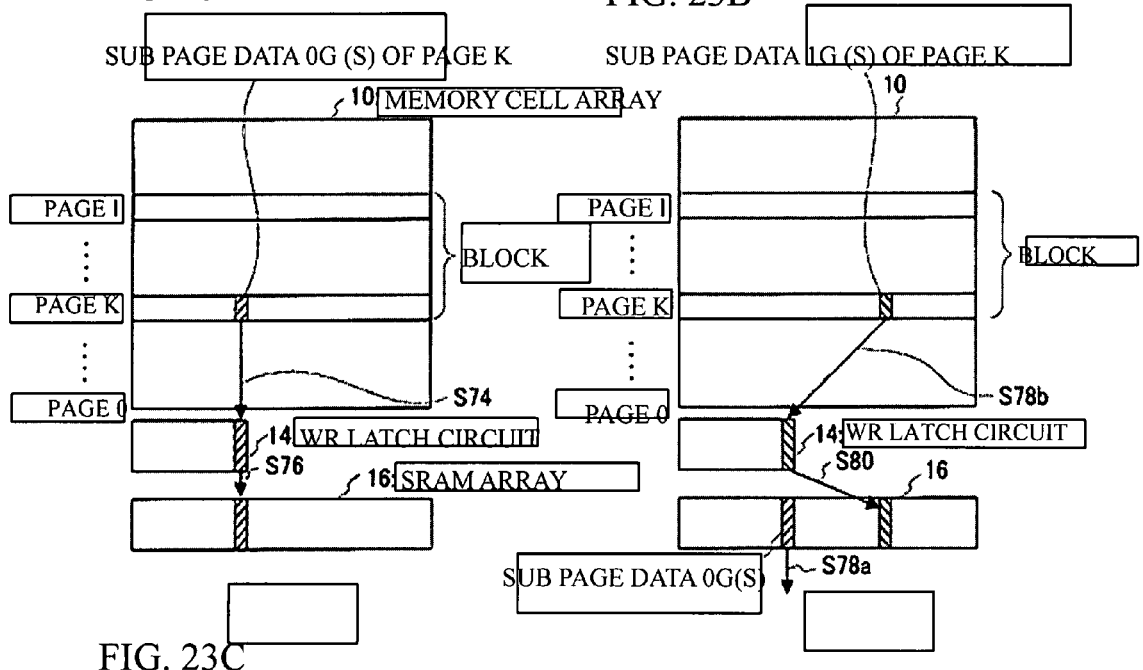
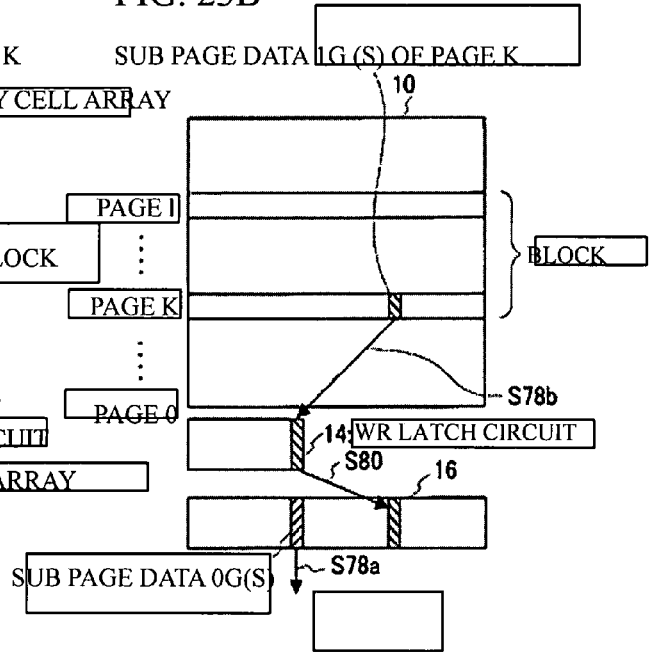
FIG. 23A
FIG. 23B
FIG. 23C
FIG. 23D
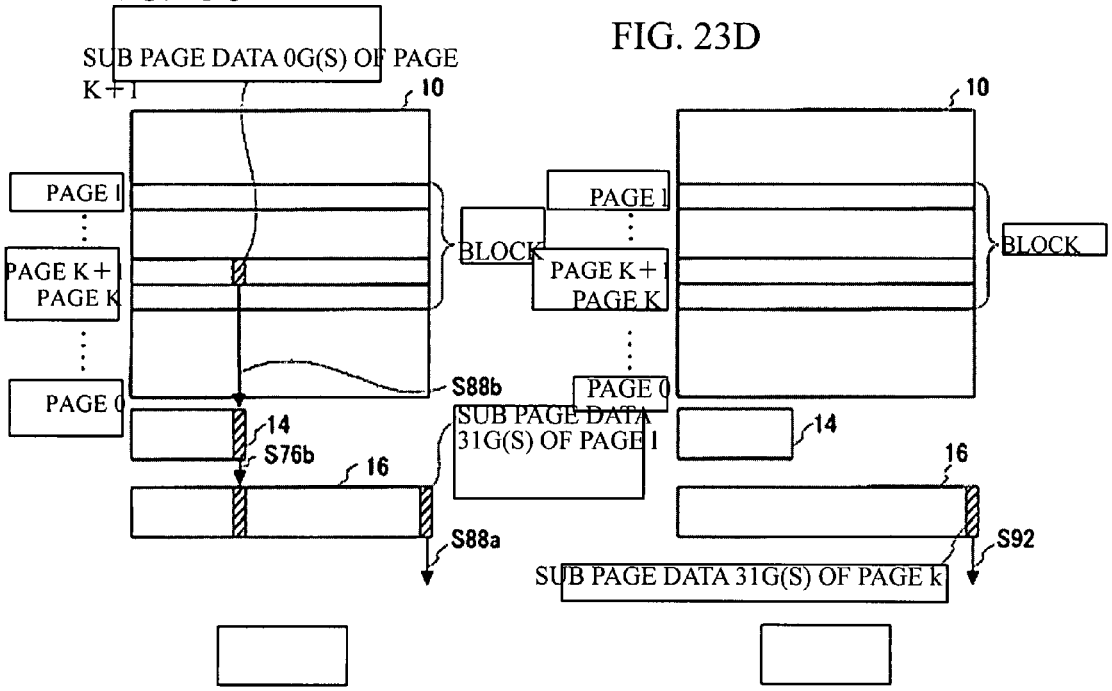

ORNAND FLASH MEMORY AND METHOD FOR CONTROLLING THE SAME

CROSS-REFERENCES TO RELATED APPLICATIONS

This is a continuation-in-part of International Application No. JP 2006/279418, filed Oct. 13, 2006 which was not published in English under PCT Article 21(2).

FIELD OF THE INVENTION

The present invention relates to a semiconductor device and a method of controlling the semiconductor device, and more particularly, to a semiconductor device that includes non-volatile memory cells and a method of controlling the semiconductor device.

BACKGROUND OF THE INVENTION

In recent years, non-volatile memories that are data-rewritable semiconductor devices have been widely used for various electronic devices such as portable telephone handsets and digital cameras. Flash memories that are typical non-volatile memories include NOR flash memories and NAND flash memories. In cases where a small amount of data for programming or the like is processed at high speeds, a NOR flash memory is often employed. In cases where a large amount of data such as image data is processed, a NAND flash memory is often employed.

A NOR flash memory includes a cell array in which the sources of memory cells are coupled together. The amount of data to be accessed by one-time writing or one-time reading is as small as several tens of bits, and the access time for reading is as short as 10 ns. On the other hand, a NAND flash memory has strings to which memory cells are coupled in series, and includes a cell array that has bit lines coupled to the respective strings. Writing and reading are collectively performed by page (2 Kbytes, for example). Therefore, the NAND flash memory has a page buffer for holding page data, and the page data is collectively written from the page buffer into the memory cell array. Also, the page data is collectively read from the memory cell array into the page buffer. Because of this structure of the memory cell array, the initial access time for reading is as long as 50 μs, but the data on one page can be continuously output. A NAND flash memory is normally formed with memory cells that have floating gates as charge accumulating layers. Writing in a memory cell is performed through a FN tunnel phenomenon caused by generating a high potential between the control gate on the floating gate and the substrate. Accordingly, a large amount of data of one page can be written at once.

Also, a copy back mode has been suggested for NAND flash memories. In the copy back mode, page data stored in the memory cells is read into the page buffer, and the page data is written (or copied) onto a page at a different address. In this mode, the data read into the page buffer is not output to the outside, but can be copied inside. Accordingly, the operating time can be shortened. The copy back mode is often used by a host side (an external circuit) for managing a file called a garbage collection for the data stored in the NAND flash memory. In each page area, the information indicating whether the stored data is valid or invalid (flag data) is stored. To carry out the garbage collection, the host side needs to read the flag data in advance.

Meanwhile, U.S. Pat. No. 6,011,725 discloses a SONOS (Silicon Oxide Nitride Oxide Silicon) flash memory as a flash memory that includes virtual-ground memory cells that switch sources and drains and symmetrically activate the sources and drains. This flash memory is one type of a NOR flash memory, and performs writing in a memory cell by applying a high voltage to the drain and the control gate of the transistor in the memory cell and injecting hot electrons into the charge accumulating layer.

Also, the leaflet of International Publication No. 02/01574 discloses a flash memory that has bit lines divided so as to perform data reading at a higher speed than in a conventional NAND flash memory. In this flash memory, the memory cell array is divided into two areas, one on the page buffer side and one on the other side. Likewise, the bit lines are divided. A dividing transistor is provided between the two areas. When the dividing transistor is switched off, data can be read from the area on the page buffer side at a high speed. When the dividing transistor is switched on, data can be read from both areas at a normal speed.

In an electronic device that sometimes needs to process data at a high speed and sometimes needs to process a large amount of data with small power consumption, it is necessary to prepare a NOR flash memory and a NAND flash memory, respectively. Also, when the host side carries out the garbage collection, it is necessary to read the flag data in advance. However, in a NAND flash memory, a long period of time is required for reading the flag data.

SUMMARY OF THE INVENTION

The present invention has been made to overcome the above drawbacks of the prior art and provide a semiconductor device that is capable of selecting between high-speed data processing and mass data processing with small power consumption in non-volatile memory, and a method of controlling such a semiconductor device.

According to an aspect of the present invention, there is provided a semiconductor device including: a memory cell array that includes non-volatile memory cells; an area that is contained in the memory cell array and stores area data; a first storage unit that holds data transferred from the memory cell array and outputs the data; and a control circuit that selects between a primary reading mode for causing the first storage unit to hold the area data transferred from the memory cell array and to output the area data, and a secondary reading mode for causing the first storage unit to hold a plurality of pieces of divisional data formed by dividing the area data and transferred from the memory cell array and to output the divisional data.

According to another aspect of the present invention, there is provided a method of controlling a semiconductor device that has a memory cell array including non-volatile memory cells, an area that is in the memory cell array and stores area data, and a first storage unit that holds data transferred from the memory cell array and later outputs the data to an outside, the method including: a primary reading operation that includes storing the area data transferred from the memory cell array into the first storage unit, and outputting the area data from the first storage unit to the outside; a secondary reading operation that includes storing plural pieces of divisional data formed by dividing the area data and transferred from the memory cell array into the first storage unit, and outputting the divisional data from the first storage unit to the outside; and selecting between a primary reading mode and a secondary reading mode. The secondary reading mode for processing data at a high speed and the primary reading mode for processing a large amount of data with smaller power consumption can be selected in one non-volatile memory.

BRIEF DESCRIPTION OF THE DRAWINGS

FIGS. 21A through 21E show the flow of data in a case where the data is read from the memory cell array in accordance with the second embodiment of the present invention;

FIG. 22 is a flowchart of a control operation to be performed by the control circuit of a flash memory in accordance with a third embodiment of the present invention;

FIGS. 23A through 23D show the flow of data in a case where the data is read from the memory cell array in accordance with the third embodiment of the present invention;

DETAILED DESCRIPTION

Reference will now be made in detail to various embodiments in accordance with the invention, examples of which are illustrated in the accompanying drawings. While the invention will be described in conjunction with various embodiments, it will be understood that these various embodiments are not intended to limit the invention to these embodiments. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details. In other instances, well known methods, procedures, components, and circuits have not been described in detail as not to unnecessarily obscure aspects of the invention.

Figure 1:
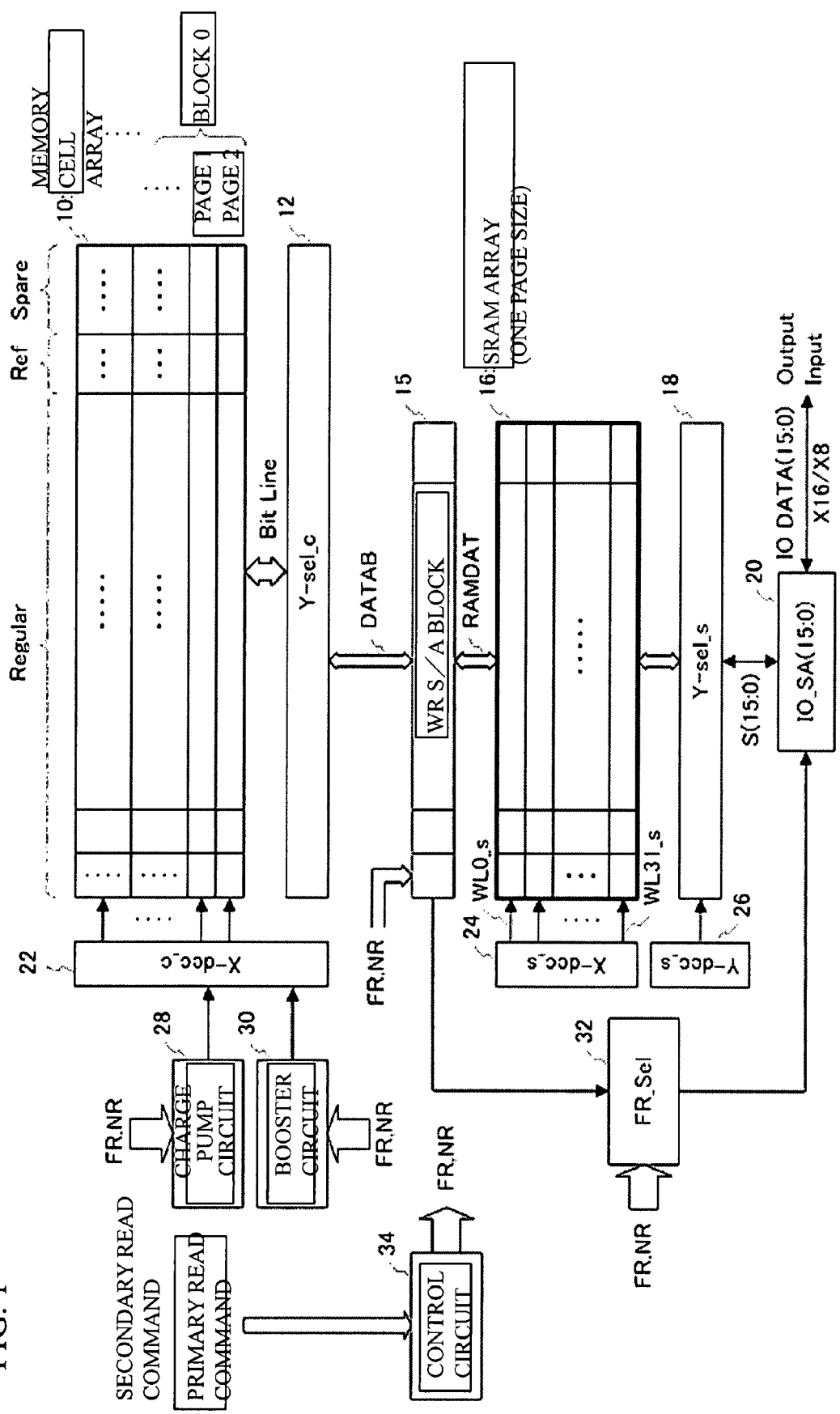
FIG. 1 is a block diagram showing the memory cell array and the surroundings of the control circuit of a flash memory in accordance with a first embodiment of the present invention.
Figure 2:
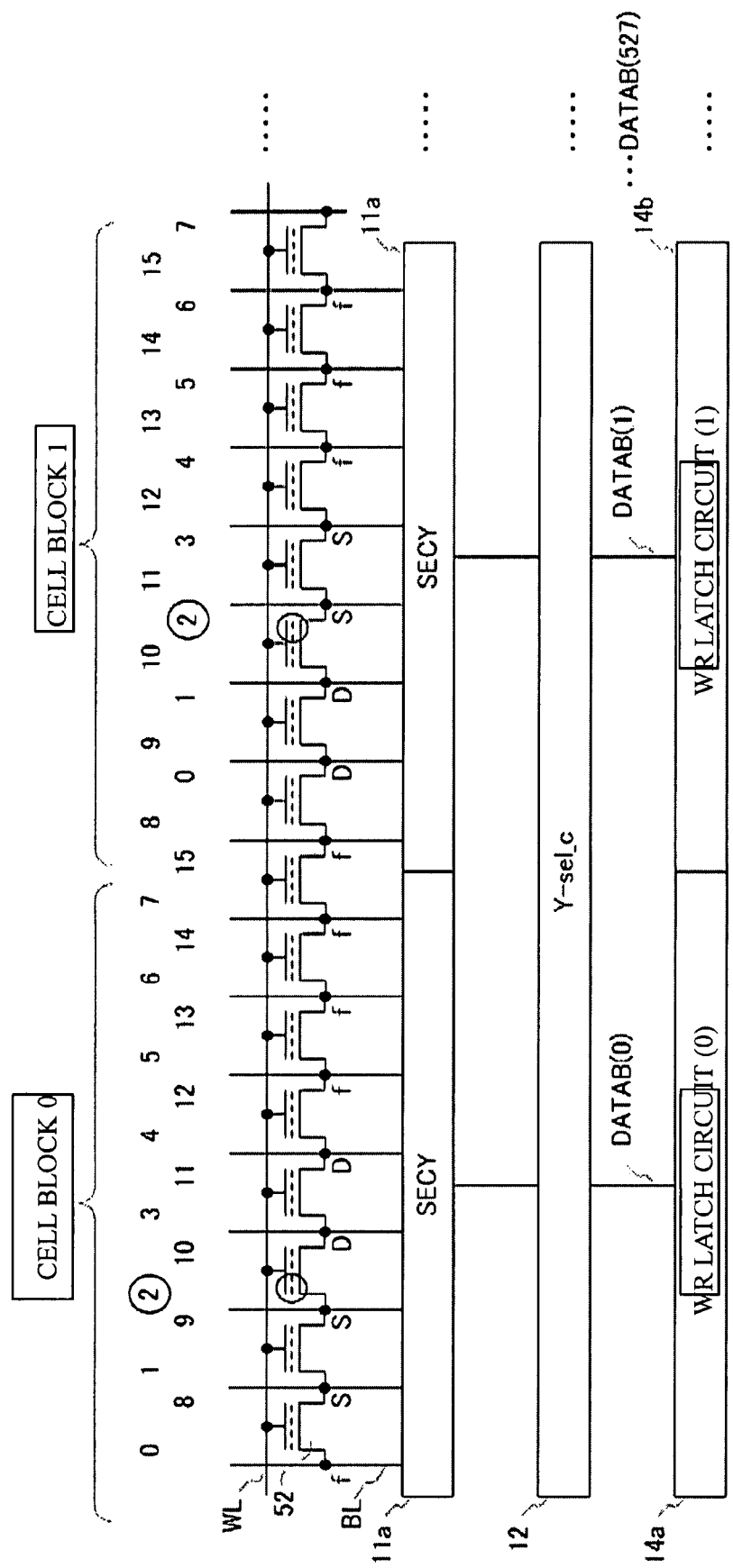
FIG. 2 illustrates the couplings among memory cells in accordance with an embodiment of the invention.

A first embodiment of the present invention is a virtual-ground flash memory, but has a NAND interface function and is capable of outputting data to external circuits by page (2 Kbytes). Further, the flash memory has a function of selecting between a primary reading mode for outputting data with low power consumption and a secondary reading mode for outputting data at a high speed with large power consumption. FIG. 1 is a block diagram showing the memory cell array and the surroundings of the control circuit of the flash memory in accordance with the first embodiment. FIG. 2 illustrates the couplings among memory cells according to an embodiment of the invention.

As shown in FIG. 1, a memory cell array 10 has memory cells arranged in a matrix fashion in conformity with word lines (not shown) extending in the transverse direction and bit lines (not shown) extending in the longitudinal direction. As shown in FIG. 2, the word lines WL are coupled to the control gate of the transistor forming each memory cell 52, and the bit lines BL are coupled to the sources and drains of the memory cells 52. The memory cells 52 are virtual-ground memory cells, and two bits can be stored in each one of the memory cells 52. An area coupled to the same word line (two word lines in practice, as described later) is equivalent to one page (area) to store page data. Referring back to FIG. 1, the areas of several pages are arranged in the longitudinal direction. In this manner, the memory cell array 10 contains the several pages. The area equivalent to one page includes a regular memory area (Regular), a reference memory area (Ref), and a spare area (Spare). The regular memory area is the area in which data to be written in the flash memory is stored, and regular data is stored. The reference memory area is the area that has the reference cells to be used as the references at the time of data reading. The spare area is the area that has the cells to store file control data or the likes, and is the area in which the flag data indicating the validity of page data is written during a copy back operation.

Inputting of external data is performed by one page. In the first embodiment, the data size of each one page is 2 Kbytes. In a regular NAND flash memory, data writing into a memory cell is performed using a FN tunnel phenomenon. In a virtual-ground flash memory, on the other hand, data writing is performed using a hot electron phenomenon. Accordingly, virtual-ground memory cells require a higher current for writing, but can store a smaller amount of data that can be written at the same time. Also, since a sense amplifier of the same type as that used in a NOR flash memory is used in a virtual-ground flash memory, a smaller number of cells can be sensed at once for reducing the consumption of current. Therefore, in the first embodiment, writing and reading are performed on the memory cell array 10 by sub page data unit that is obtained by dividing the data of one page. In the first embodiment, the data size of one sub page is 528 bits (512 bits of which is regular data, and 16 bits of which is spare data). In the primary reading mode, the memory cells of one sub page are sensed at the same time. In the secondary reading mode, the cells of one unit formed by dividing one sub page are sensed at the same time.

A command for selecting the secondary reading mode or the primary reading mode is to be input to a control circuit 34. In accordance with this command, the control circuit 34 selects the secondary reading mode or the primary reading mode, and outputs a FR or NR signal. In the case of the secondary reading mode, the FR signal is at the high level. In the case of the primary reading mode, the NR signal is at the high level. It should be noted that FRB and NRB indicate the complementary signals of the RF and NR signals, respectively. The operation of the control circuit 34 will be described later.

A X-dec_c 22 is an X-decoder, and is a circuit that selects the word lines of the memory cell array 10. A Y-sel_c 12 is a circuit, coupled to the memory cell array 10 via a bit line, that selects the memory cells storing the data of one sub page (528 bits) of one page. A charge pump circuit 28 and a booster circuit 30 are circuits that supply high voltages necessary for data writing, reading, or erasing. When data is to be read from a memory cell, the FR or NR signal is input from the control circuit 34 to the charge pump circuit 28 and the booster circuit 30. In accordance with the FR or NR signal, the charge pump circuit 28 and the booster circuit 30 in turn supply a high voltage to the X-dec_c 22.

A WR sense amplifier block 15 is coupled to the Y-sel_c 12 with DATAB. The WR sense amplifier block 15 is a circuit that writes data from an SRAM array 16 into the memory cell array 10 or reads data by the sub page unit. In the secondary reading mode, the WR sense amplifier block 15 is a circuit that outputs data to an IO_SA(15:0) 20. The WR sense amplifier block 15 includes a cascode circuit and a sense amplifier for reading data from the memory cell array 10, and a WR latch circuit 14 that temporarily holds data to be written into or read from the memory cell array 10. The cascode circuit, the sense amplifier, and the WR latch circuit 14 are provided for the amount of data of one sub page, which is 528 bits. The FR or NR signal is input from the control circuit 34 to the WR sense amplifier block 15, and operations to be performed in the primary reading mode and the secondary reading mode will be described later.

The SRAM array 16 is coupled to the WR sense amplifier block 15 with RAMDAT, and is coupled to the IO_SA(15:0) 20 via a Y-sel_s 18. The SRAM array 16 has SRAM cells arranged in an array. The SRAM cells coupled to one word line (or the SRAM cells in one row) are equivalent to the data of one sub page. In other words, the SRAM cells equivalent to 528 bits are arranged in each one row, and 32 rows are arranged in the vertical direction in the drawing. Accordingly, the SRAM cells of 2 Kbytes, which is equivalent to one page, are arranged in the SRAM array 16. Like the memory cell array 10, the SRAM array 16 includes a regular memory area (Regular), a reference memory area (Ref), and a spare area (Spare). An X-dec_'s 24 is the X-decoder for the SRAM array 16, and selects the word lines WL0_s through WL31_s of the SRAM array 16. In accordance with an instruction from a Y-dec_s 26, the Y-sel_s 18 selects the bit lines of the SRAM array 16, and transfers data to the IO_SA(15:0) 20.

A FR_Sel 32 is a circuit that outputs data from the WR latch circuit 14 directly to the IO_SA(15:0) 20, not using the SRAM array 16, in a case where the FR or NR signal is input from the control circuit 34 and the secondary reading mode is selected. The IO_SA(15:0) 20 is a circuit that inputs or outputs data IO DATA(15:0) from or to the outside every 16 bits.

As shown in FIG. 2, eight memory cells 52 constitute a cell block that is the smallest decoding unit. Two bits of data can be stored in the left and right sides of one cell. As for the memory cells 52 in the cell block 0, addresses 0 through 7 are allotted to the left bits, and addresses 8 through 15 are allotted to the right bits. As for the memory cells 52 in the cell block 1 adjacent to the cell block 0, addresses 0 through 7 are allotted to the right bits, and the addresses 8 through 15 are allotted to the left bits. In this manner, the addresses are symmetrical between each two adjacent cell blocks, so as to restrain leakage current between the two adjacent cell blocks. The number of cell blocks coupled to one word lines WL is 528 (equivalent to the data amount of one sub page). The data amount calculated by multiplying 16 bits by the number of cell blocks coupled to two word lines WL, which is 1056, is almost equivalent to 2 Kbytes, which is the data amount of one page. The data at the same address of the respective cell blocks (528 pieces of data at an address 2, for example) constitute the sub page data of 528 bits. The addresses in each of the cell blocks are selected by a SECY 11a and the Y-sel_c 12, and are coupled to WR latch circuits 14a and 14b in the WR sense amplifier block 15 via DATAB. One DATAB and one WR latch circuit 14 are provided for each one of the cell blocks. Accordingly, there are 528 of them provided.

An example case where the address 2 is selected for reading data from the memory cells 52 is now described. First, the word line WL to which the subject memory cells 52 are coupled is selected by the X-dec_c 2, and a voltage for reading data is applied to the control gate. In the cell block 0, the bit line BL on the source sides of the cells at the addresses 2 and 1 becomes "S", and a voltage of 0 V is applied to this bit line BL. The bit line BL on the drain sides of the cells at the addresses 2 and 3 becomes "D", and a voltage of 1.4 V is applied to this bit line BL. The other bit lines BL remain floating (F). In the cell block 1, the bit line BL on the source sides of the cells at the addresses 2 and 3 becomes "S", and a voltage of 0 V is applied to this bit line BL. The bit line BL on the drain sides of the cells at the addresses 2 and 1 becomes "D", and a voltage of 1.4 V is applied to this bit line BL. The other bit lines BL remain floating (F). In this manner, data is read from the cell at the address 2 in each of the cell block.

Figure 3:
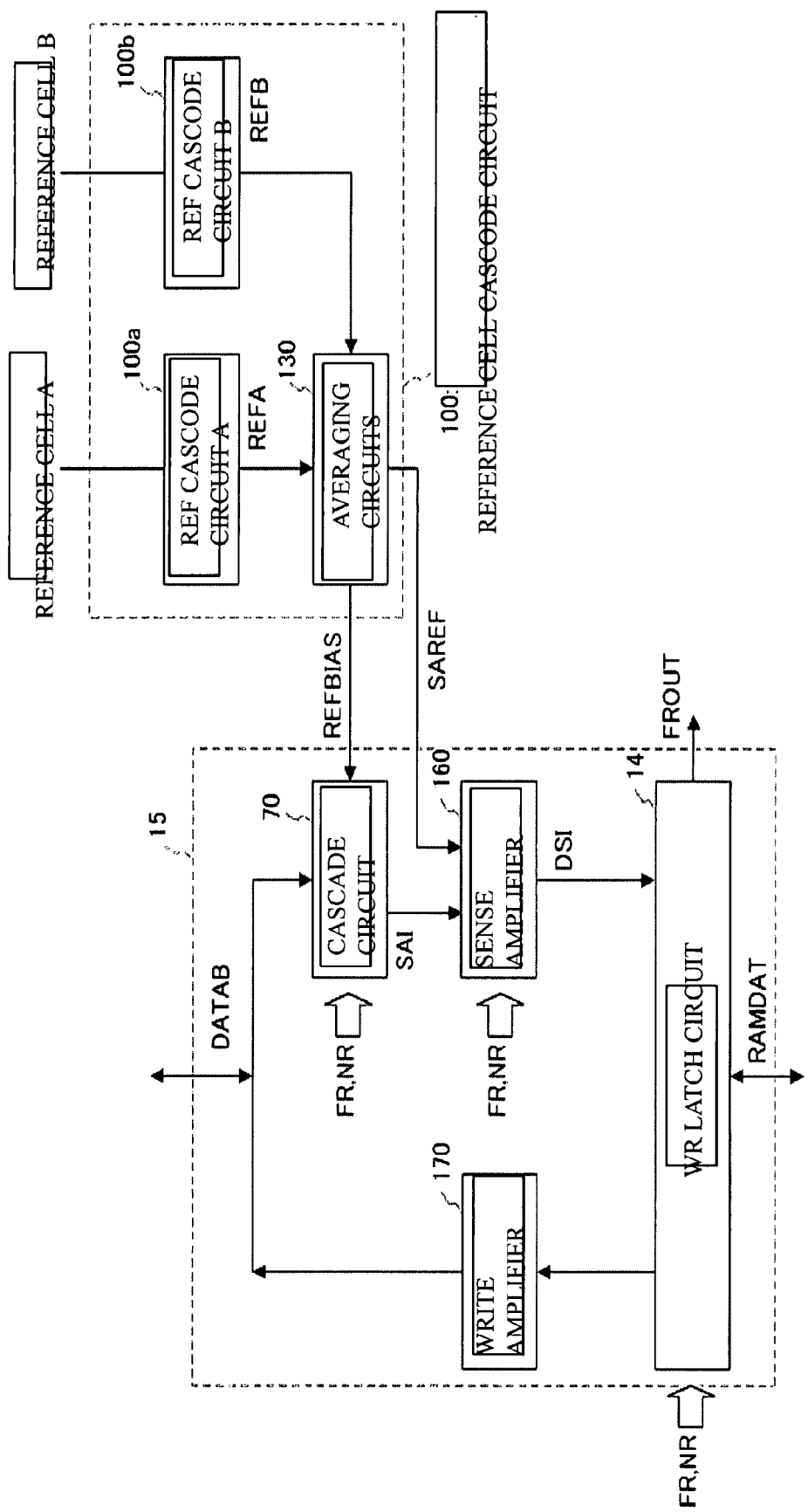
FIG. 3 is a block diagram of a 1-bit portion of a WR sense amplifier block and the reference cell cascode circuit in accordance with an embodiment of the invention.

FIG. 3 is a block diagram of one bit of the WR sense amplifier flock 15, and a block diagram of a reference cell cascode circuit 100 according to an embodiment of the invention. As shown in FIG. 3, the WR sense amplifier block 15 includes a cascode circuit 70, a sense amplifier 160, the WR latch circuit 14, and a write amplifier 170. The memory cell array 10 is coupled to the cascode circuit 70 via DATAB. The cascode circuit 70 is a current-voltage converting circuit that converts the current of the memory cell to a voltage. The cascode circuit 70 receives REFBIAS from the reference cell cascode circuit 100, and differential-amplifies the difference between the current of the memory cell and the current of the reference cell. The cascode circuit 70 then outputs a voltage SAI to the sense amplifier 160. The sense amplifier 160 differential-amplifies the difference between the output SAI of the cascode circuit 70 and an output SFREF of the reference cell cascode circuit 100. The sense amplifier 160 also determines whether the output SAI is larger than the outputs SAREF and REFBIAS. Based on the comparison result, the sense amplifier 160 determines whether the data of the memory cell is "1" or "0", and then outputs "1" or "0" to the WR latch circuit 14. When data is read from the memory cell array 10, the WR latch circuit 14 holds the data of the memory cell array 10, and later outputs the data to the outside. When data is written, the WR latch circuit 14 holds the data to be written. In the secondary reading mode, the WR latch circuit 14 outputs data read from the memory cell array 10 to FROUT. In the primary reading mode, the WR latch circuit 14 outputs data read from the memory cell array 10 to RAMDAT.

The reference cell cascode circuit 100 includes a Ref cascode circuit A 100a, a Ref cascode circuit B 100b, and averaging circuits 130. The Ref cascode circuit A 100a is coupled to a reference cell A that is the reference for the data "0". The Ref cascode circuit A 100a converts the current flowing through the reference cell A to a voltage REFA. The Ref cascode circuit B 100b is coupled to a reference cell B that is the reference for the data "1". The Ref cascode circuit B 100b converts the current flowing through the reference cell B to a voltage REFB. The averaging circuits 130 calculate the average value between REFA and REFB, and outputs SAREF and REFBIAS.

Figure 4:
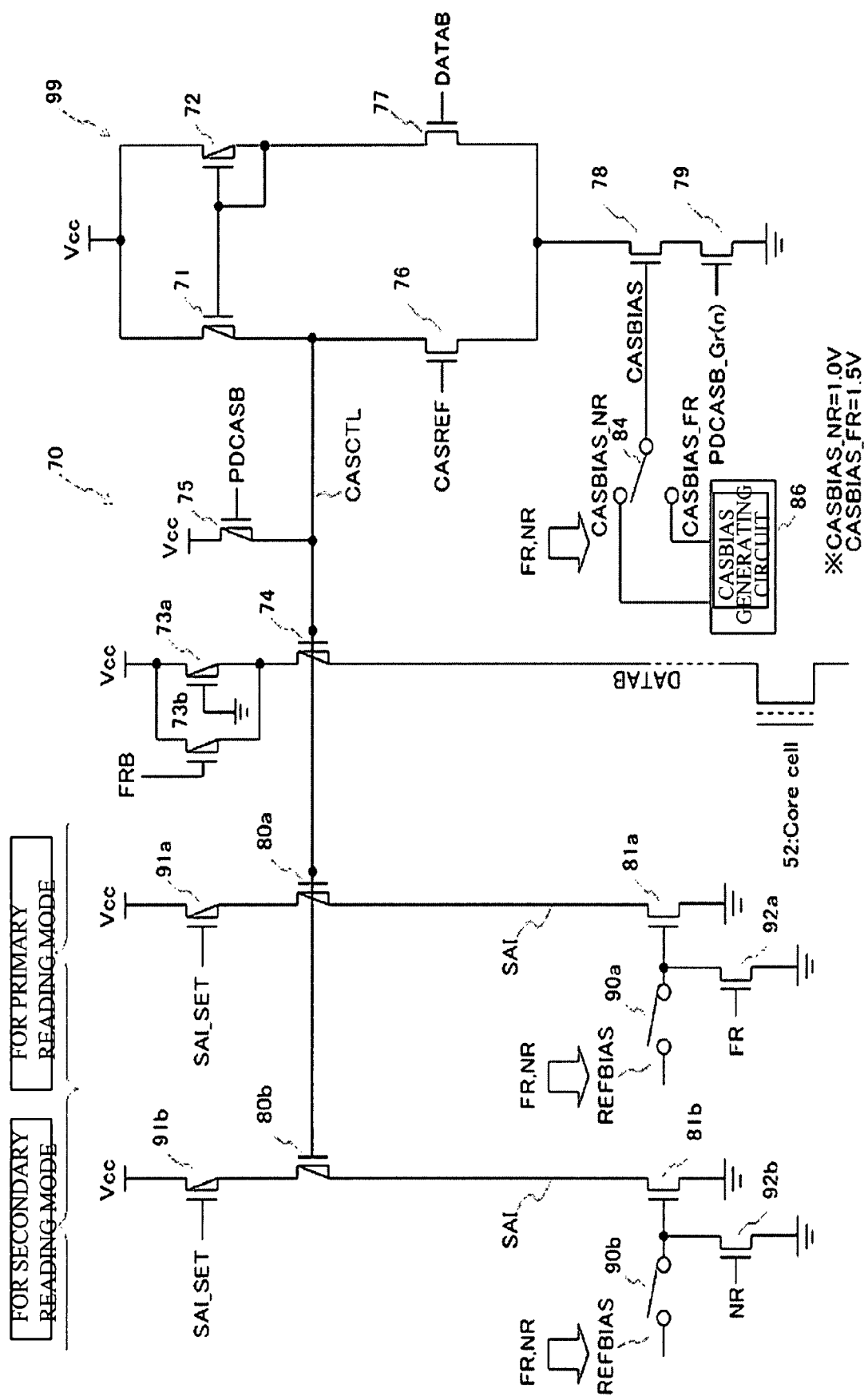
FIG. 4 is a circuit diagram of the cascode diagram in accordance with an embodiment of the invention.

FIG. 4 is a circuit diagram of the cascode circuit 70 according to an embodiment of the invention. The bit line coupled to the memory cell 52 is coupled to DATAB. A current-mirror differential amplifier circuit 99 is formed with p-FETs 71 and 72 and n-FETs 76 and 77, and is provided between a power supply Vcc and the ground. DATAB is input to the gate of the FET 77, and a reference voltage CASREF (1.4 V) is input to the gate of the FET 76. A FET 78 is a current source for adjusting the current flowing through the differential amplifier circuit 99, and a predetermined reference voltage CASBIAS is input to the gate of the FET 78. A CASBIAS generating circuit 86 generates a voltage CASBIAS_NR for the primary reading mode, and a voltage CASBIAS_FR for the secondary reading mode. In accordance with the FR or NR signal that is output from the control circuit 34, a switch 84 selects the voltage CASBIAS_NR or the voltage CASBIAS_FR, and converts the selected voltage to CASBIAS. Here, the voltage CASBIAS_NR is 1.0 V, and the voltage CASBIAS_FR is 1.5 V. Since CASBIAS becomes larger in the secondary reading mode, the current flowing through the FET 78 is higher. Accordingly, the operating time of the differential amplifier circuit 99 is shortened. An n-FET 79 is coupled to the differential amplifier circuit 99. PDCASB_Gr (n) is input to the gate of the FET 79. PDCASB_Gr(n) is an enabling signal for activating the cascode circuit 70. In the primary reading mode, all the 528 cascode circuits 70 are activated. In the secondary reading mode, only some of the cascode circuits 70 are activated, since reading is performed by the unit formed by dividing one sub page.

A p-FET 75 that is switched on and off with an enabling signal PDCASB is coupled between an output CASCTL of the differential amplifier circuit 99 and the power supply Vcc. The output CASCTL of the differential amplifier circuit 99 is coupled to the gate of a p-FET 74. The drain of the FET 74 is coupled to DATAB. The source of the FET 74 is coupled to Vcc via p-FETs 73a and 73b. If the voltage of DATAB is lower than the reference voltage CASREF, the FET 74 allows a higher current to flow. If the voltage of DATAB is higher than the reference voltage CASREF, the FET 74 allows a lower current to flow. In this manner, the bit lines are precharged to the reference voltage CASREF via DATAB. The p-FET 73a between the FET 74 and Vcc has its gate grounded, and functions as a resistance. The FET 73b provided in parallel with the p-FET 73a has sufficiently large W/L with respect to the FET 73a, and the signal FRB as the complementary signal of the FR signal is input to the gate of the FET 73b. In the secondary reading mode, the FET 73b is turned on, so as to precharge the bit lines at a high speed.

The output CASCTL of the differential amplifier circuit 99 is coupled to the gate of p-FETs 80a and 80b. Further, p-FETs 91a and 91b are coupled between Vcc and the sources of the FETs 80a and 80b, respectively. SAI_SET is input to the gates of the FETs 91a and 91b. When SAI_SET is at the low level, the FETs 91a and 91b are activated. The drains of the FETs 80a and 80b are coupled to the output SAI of the cascode circuit 70. Since the gates of the FETs 80a and 80b is also the gate of the FET 74, the FETs 80a and 80b have low impedance when the FET 74 has low impedance so as to let a high current flow through the memory cell 52. Accordingly, the current flowing through the memory cell 52 can be converted into the voltage SAI.

The drains of n-FETs 81a and 81b are coupled to SAI, the sources of the FETs 81a and 81b are grounded, and the gates of the FETs 81a and 81b are coupled to the output REFBIAS of the reference cell cascode circuit 100 via switches 90a and 90b. The switch 90a is switched on when the NR signal is input and the primary reading mode is selected. The switch 90b is switched on when the FR signal is input and the secondary reading mode is selected. The FR signal and the NR signal are input to the gates of FETs 92a and 92b. In the primary reading mode, the FET 81b is switched off. In the secondary reading mode, the FET 81a is switched off. The FETs 80b, 81b, and 91b for the secondary reading mode have larger W/L than the FETs 80a, 81a, and 91a for the primary reading mode. For example, in the secondary reading mode, the W/L of the FETs 80b, 81b, and 91b for the secondary reading mode is adjusted so that the current flowing through SAI becomes eight times as high as that in the primary reading mode. In this manner, a higher current can be applied to the output SAI of the cascode circuit 70 in the secondary reading mode than in the primary reading mode.

Figure 5:
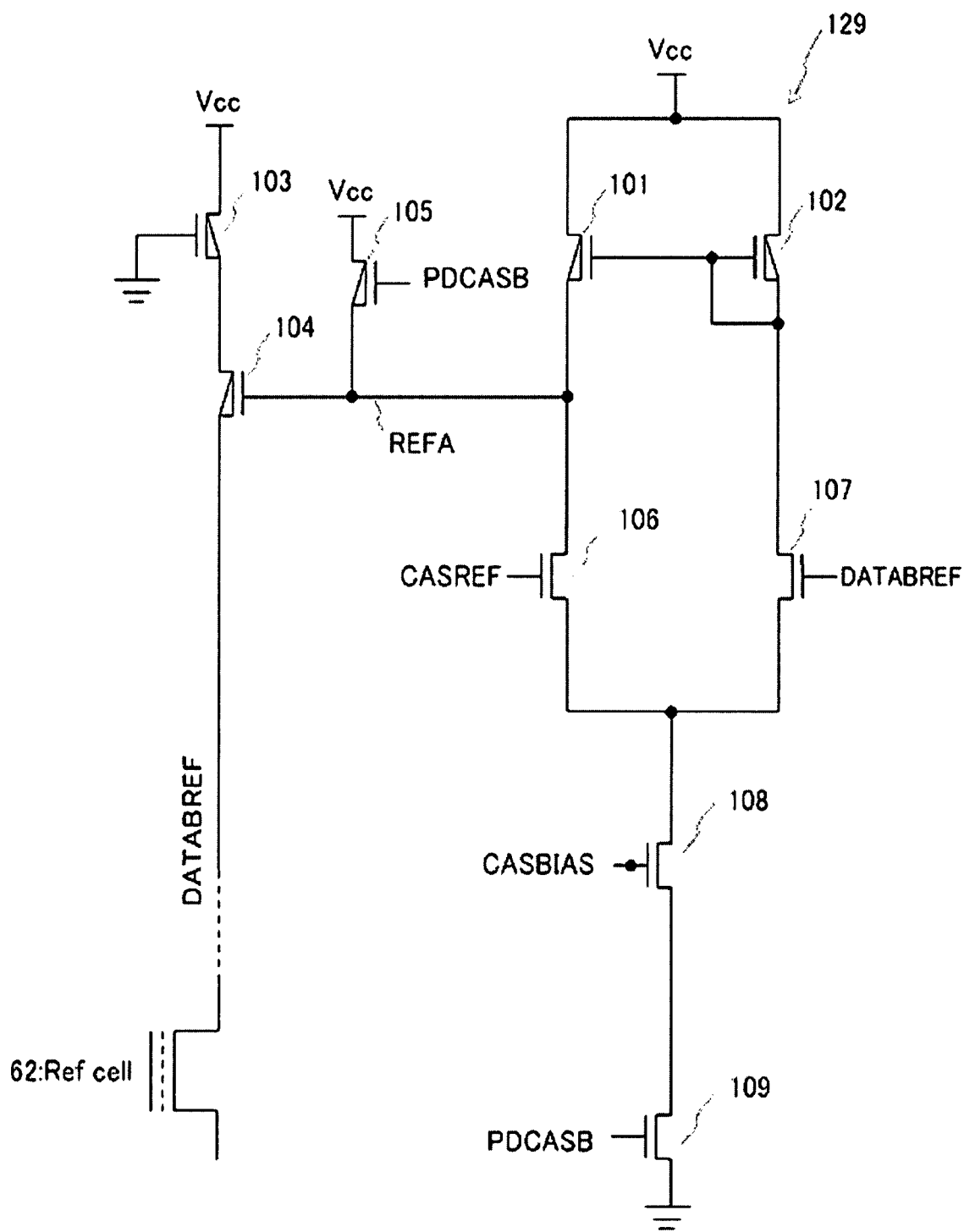
FIG. 5 is a circuit diagram of the Ref cascode circuit A in accordance with an embodiment of the invention.

FIG. 5 is a circuit diagram of the Ref cascode circuit A 100a according to an embodiment of the invention. As the Ref cascode circuit B 100b has the same structure as the Ref cascode circuit A 100a, explanation of the Ref cascode circuit B 100b is omitted herein. The Ref cascode circuit A 100a is coupled to a reference cell 62 that is a reference for the data "0". A differential amplifier circuit 129 and p-FETs 103, 104, and 105 have the same functions as the differential amplifier circuit 99 and the p-FETs 73a, 74, and 75, respectively, of the cascode circuit 70 shown in FIG. 5. Accordingly, DATABREF coupled to the bit line of the reference cell is precharged to the same voltage as CASREF. An output REFA of the differential amplifier circuit 129 is output to the averaging circuits 130.

Figure 6:
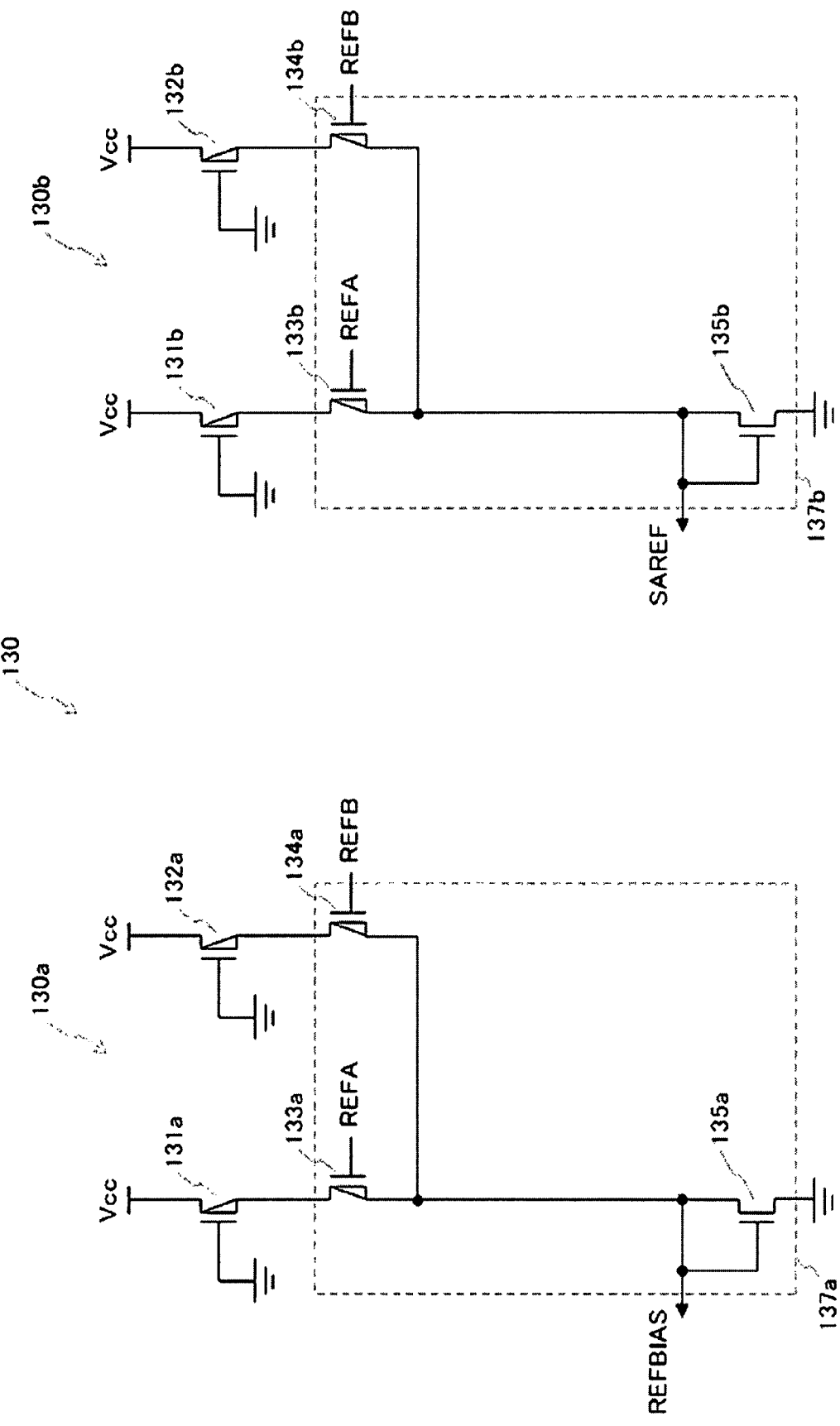
FIG. 6 is a circuit diagram of the averaging circuits in accordance with an embodiment of the invention.

FIG. 6 is a circuit diagram of the averaging circuits 130 according to an embodiment of the invention. Averaging circuits 130a and 130b are the same circuits, except for the different outputs REFBIAS and SAREF. The averaging circuit 130a includes p-FETs 131a, 132a, 133a, and 134a, and an n-FET 135a. The FETs 131a and 132a are current sources having gates grounded. REFA and REFB are input to the gates of the FETs 133a and 134a, respectively. The FETs 131a and 132a are coupled to the sources of the FETs 133a and 134a, respectively. The drains of the FETs 133a and 134a are coupled to REFBIAS. The FET 135a has its gate and drain coupled to REFBIAS, and its source grounded. Accordingly, the FET 135a functions as a diode. With the above structure, the currents flowing through the 133a and 134a that are input with REFA and REFB are combined and then output. In this manner, the average value between the output (REFA) of the Ref cascode circuit A 100a and the output (REFB) of the Ref cascode circuit B 100b, which are the output of the averaging circuits 130, is output as an output of the reference cell cascode circuit 100.

Since the averaging circuit 130b is the same as the averaging circuit 130a, explanation of the averaging circuit 130b is omitted herein. An output signal (REFBIAS) of the averaging circuit 130a is output to the cascode circuit 70, and an output signal (SAREF) of the averaging circuit 130b is output to the sense amplifier 160. It is possible to employ only one averaging circuit that has two outputs REFBIAS and SAREF. However, two averaging circuits can prevent noises of REFBIAS and SAREF from adversely affecting each other.

Figure 7:
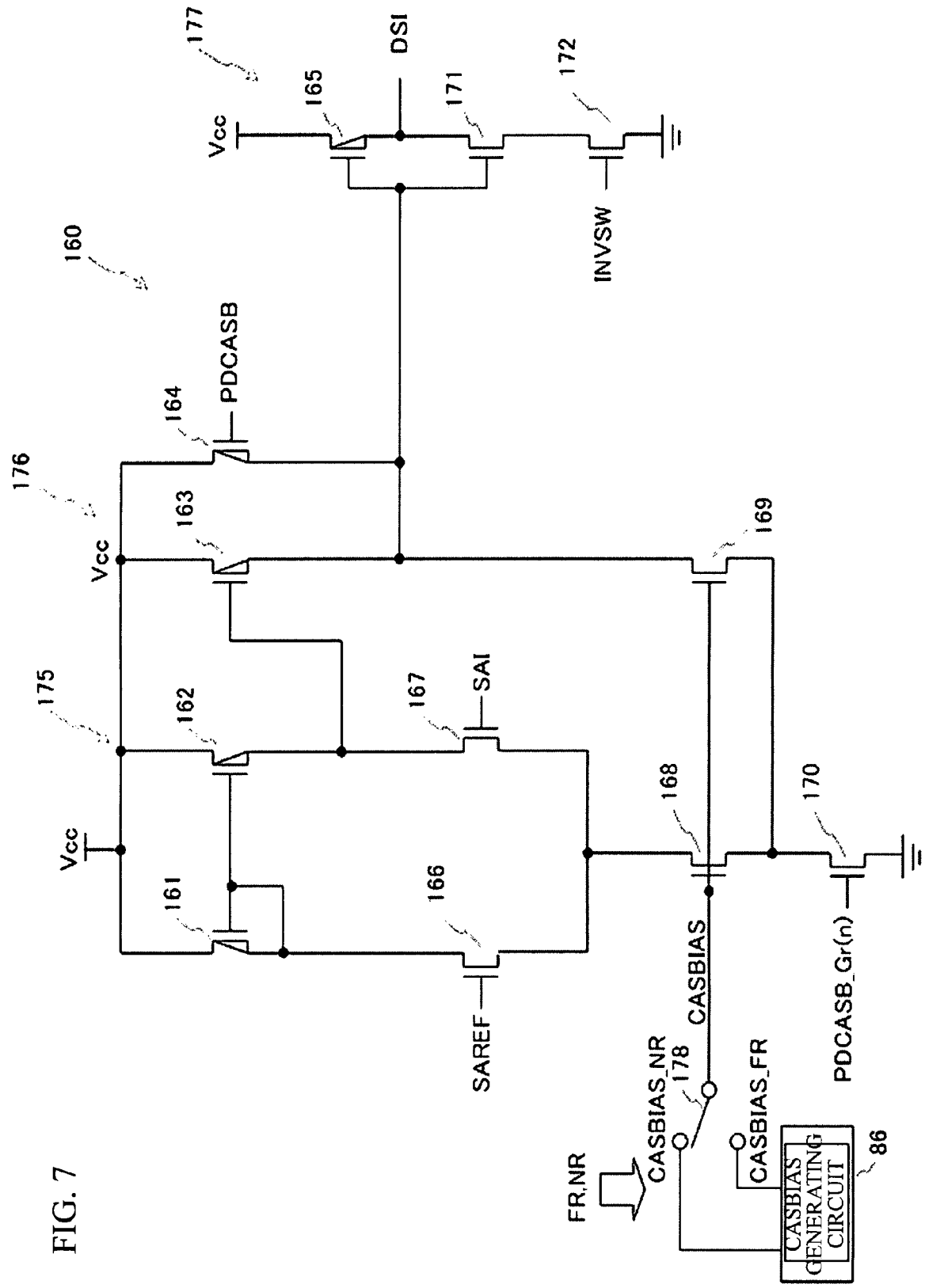
FIG. 7 is a circuit diagram of the sense amplifier circuit in accordance with an embodiment of the invention.

FIG. 7 is a circuit diagram of the sense amplifier 160 according to an embodiment of the invention. The sense amplifier 160 includes a current-mirror differential amplifier circuit 175 formed with p-FETs 161 and 162 and n-FETs 166, 167, and 168, an amplifier circuit 176 formed with a p-FET 163 and an n-FET 169, and an inverter 177 formed with a p-FET 165 and an n-FET 171. FETs 164, 170, and 172 are switches that switch on the sense amplifier 160 by means of switch signals PDCASB, PECAS_Gr(n), and INVSW, respectively.

The output SAI of the cascode circuit 70 and the output SAREF of the reference cell cascode circuit 100 are input to the differential amplifier circuit 175. If SAI is lower than SAREF, the amplifier circuit 176 outputs a low-level signal, and the inverter 177 outputs a high-level signal to an output DSI of the sense amplifier 160. If SAI is higher than SAREF, the amplifier circuit 176 outputs a high-level signal, and the inverter 177 outputs a low-level signal to DSI.

As described above, the output SAI of the cascode circuit 70 is compared with the output SAREF of the reference cell cascode circuit 100, so that the value of the current flowing in the memory cell 52 is compared with the value of the current flowing in the reference cell. In this manner, the data in the memory cell 52 is determined whether to be "1" or "0".

CASBIAS is input to the gates of the FETs 168 and 169 that are the current sources for the differential amplifier circuit 175 and the amplifier circuit 176. As in the case with the FET 78 shown in FIG. 4, CASBIAS is a signal that is selected by a switch 178 based on CASBIAS_FR and CASBIAS_NR generated by a CASBIAS generating circuit 86. In the secondary reading mode, the currents from the current sources can be made higher than in the primary reading mode. Accordingly, the operating times of the differential amplifier circuit 175 and the amplifier circuit 176 are shortened in the secondary reading mode.

Figure 8:
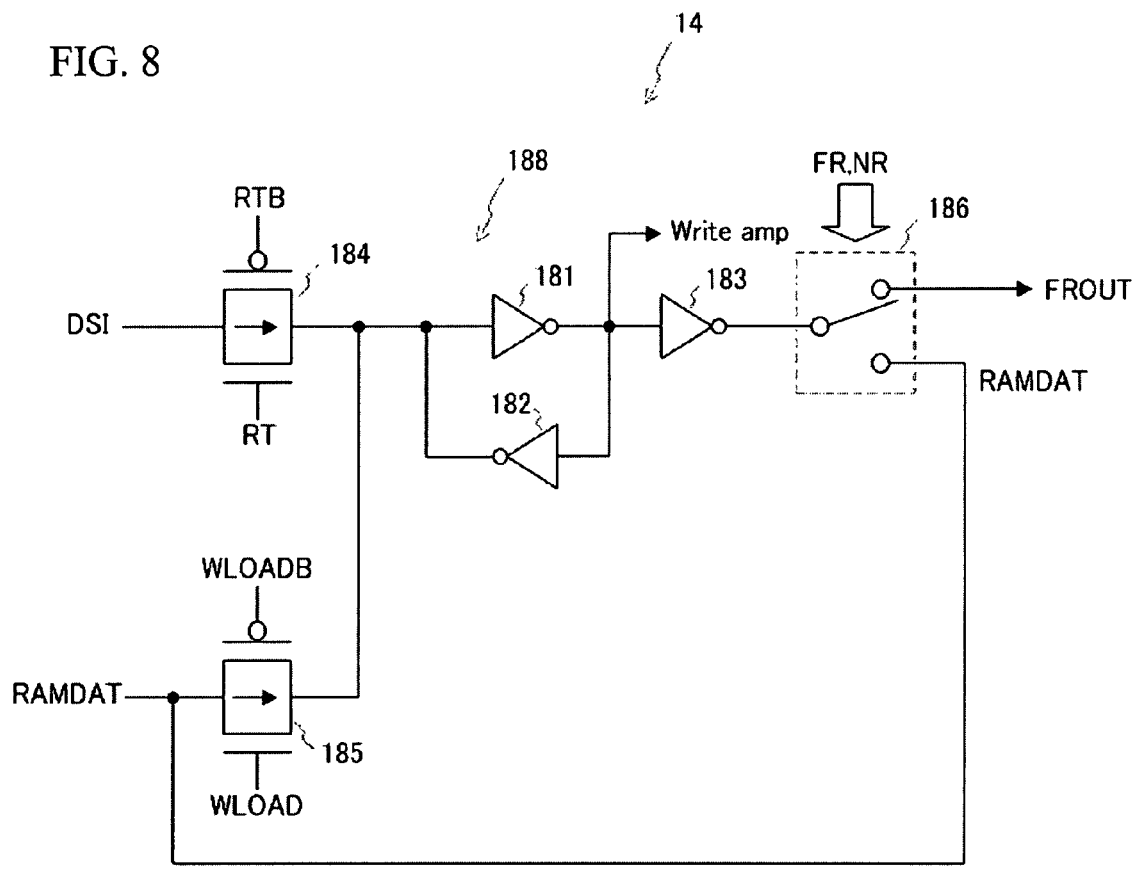
FIG. 8 is a circuit diagram of a WR latch circuit in accordance with an embodiment of the invention.

FIG. 8 is a circuit diagram of the WR latch circuit 14 according to an embodiment of the invention. The WR latch circuit 14 includes a flip-flop 188 formed with inverters 181 and 182. When data is read from the memory cell 52, the output DSI of the sense amplifier 160 is input from a transfer gate 184 to the flip-flop 188, and is stored in the flip-flop 188. In other words, the output DSI is stored in the WR latch circuit 14. A switch 186 selects an output destination for the stored data, based on the FR or NR signal. In the primary reading mode, the stored data is inverted by an inverter 183, and is output to RAMDAT. In the secondary reading mode, the stored data is output to FROUT. When data is written into the memory cell 52, the data on RAMDAT (the SRAM array 16) that is output from the SRAM array 16 is input from the transfer gate 185 to the flip-flop 188, and is stored in the flip-flop 188. The data is then output to the write amplifier 170.

Figure 9:
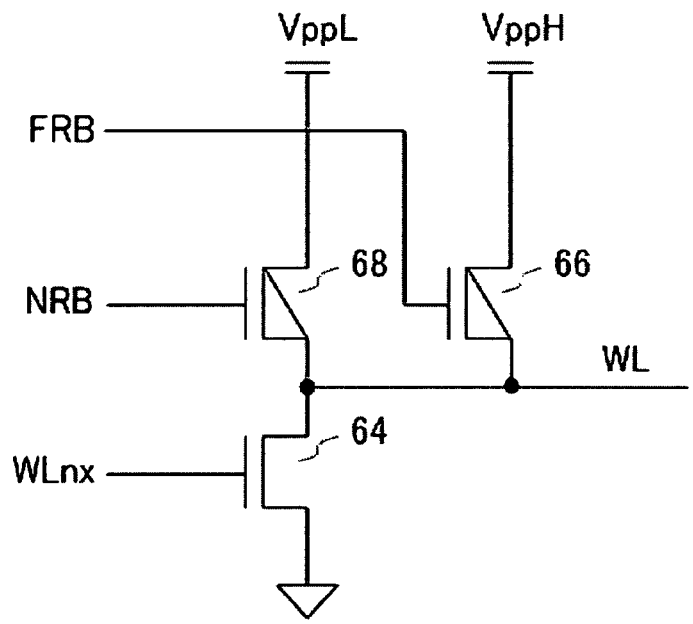
FIG. 9 is a circuit diagram of a part of the X-dec_c circuit in accordance with an embodiment of the invention.

FIG. 9 is a circuit diagram of a part of the X-dec_c 22 according to an embodiment of the invention. A voltage source VppL generated from the charge pump circuit 28 for the primary reading mode and a voltage source VppH generated from the booster circuit 30 for the secondary reading mode are coupled to a word line WL via p-FETs 68 and 66, respectively. The word line WL is grounded via an n-FET 64. NRB and FRB are input to the FETs 68 and 66, respectively. In this manner, in the primary reading mode, VppL is applied to the gate of the memory cell 52 through the word line WL. In the secondary reading mode, VppH, which is higher than VppL, is applied to the gate of the memory cell 52 through the word line WL. Since the reference cells A and B are coupled to the word line WL to which the memory cell 52 is coupled, VppH, which is higher than VppL, is also applied to the reference cells A and B in the secondary reading mode.

Figure 10:
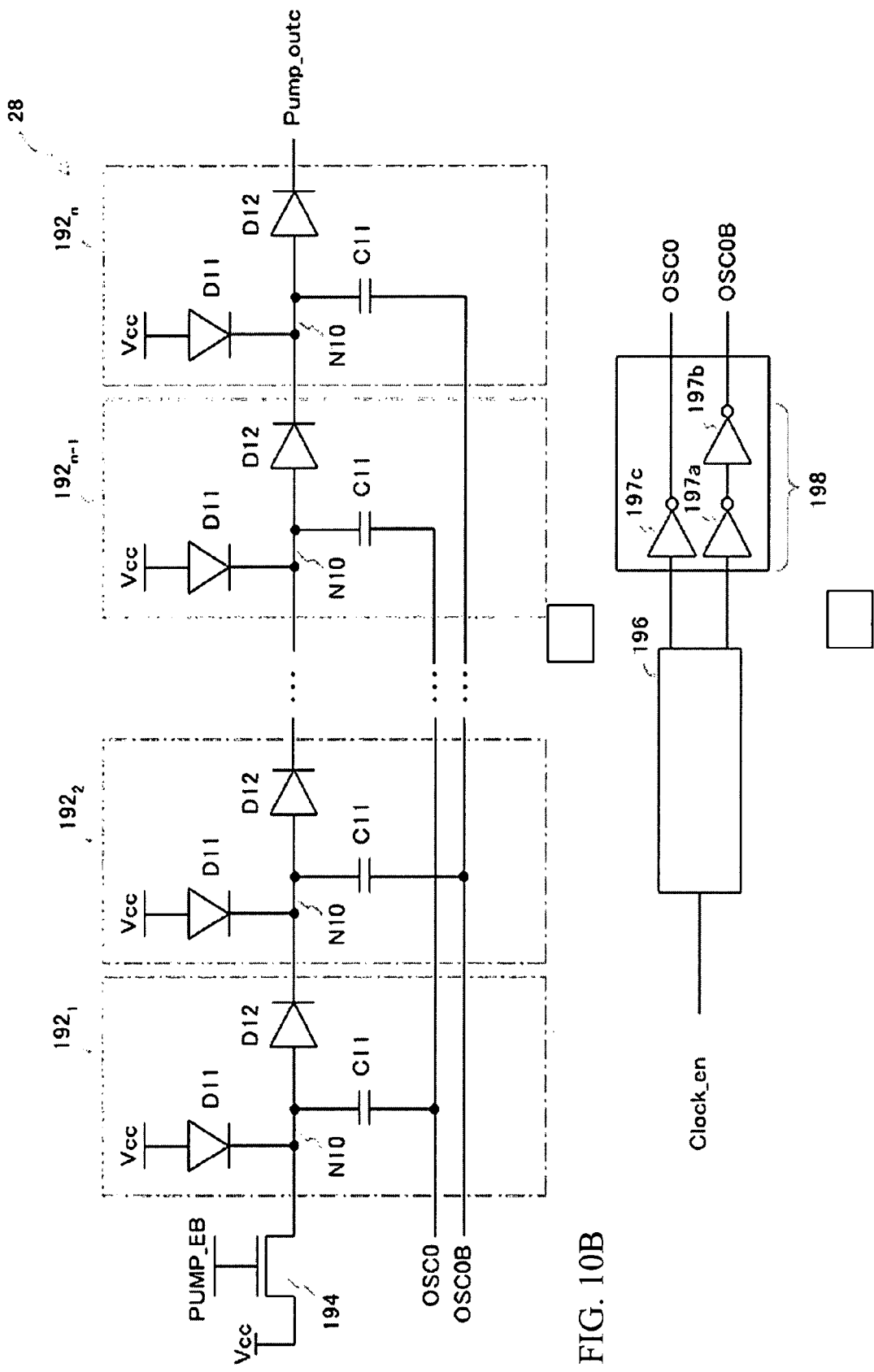
FIGS. 10A and 10B are circuit diagrams of the charge pump circuit in accordance with an embodiment of the invention.

FIG. 10A is a circuit diagram of the charge pump circuit 28 according to an embodiment of the invention. The charge pump circuit 28 includes an FET 194 and boosting steps $192_1$ through $192_n$. FIG. 10B illustrates the structure of an oscillator that supplies clock signals to the charge pump circuit 28. A part 196 of the oscillator outputs a clock based on a signal Clock_en. An inverter 197c inverts and amplifies this output to OSC0. Inverters 197a and 197b invert and amplify this output to OSC0B. Here, OSC0 and OSC0B serve as clock signals that are complementary to each other. As shown in FIG. 10A, the FET 194 is provided between a power supply Vcc and the boosting step $192_1$, and a pump enabling signal PUMP_EN is input to the gate of the FET 194. The FET 194 is a switch that switches on a sub pump 190 in accordance with the pump enabling signal PUMP_EN. In the boosting step $192_1$, a diode D11 is coupled from a power supply Vcc to a node N10 in the forward direction, and a capacitor C11 is coupled between the node N10 and OSC0. A diode D12 is further coupled in the forward direction from the node N10 to a node N10 of the next boosting step $192_2$. The next boosting step $192_2$ has the same structure as the boosting step $192_1$, except that the capacitor C11 is coupled to OSC0B. In this manner, n boosting steps are coupled, so as to output Pump_outc through the nth boosting step $192_n$.

The node N10 of the boosting step $192_1$ is precharged to Vcc-Vth (the forward high voltage of the diode) by the diode D11. When OSC0 is switched to the high level, the capacitor C11 is boosted. Since OSC0B coupled to the capacitor C11 of the next step is at the low level here, the charges stored in the capacitor C11 are transferred to the capacitor C11 of the next boosting step $192_2$ via the diode D12. Likewise, when OSC0B is switched to the high level, the charges stored in the capacitor C11 of the boosting step $192_2$ are transferred to the capacitor C11 of the next boosting step $192_3$. At this point, no charges are transferred to the previous boosting step $192_1$ via the diode D12. In this manner, the voltage of the node N10 becomes higher in a later boosting step, and the voltage boosted through the n boosting steps becomes Pump_outc. Pump_outc is maintained at a predetermined high voltage by a regulation circuit (not shown). In this manner, when data is read from the memory cell array 10, the oscillator 196 operates to keep actuating the charge pump circuit 28, so as to maintain a high voltage for a long period of time. However, as the boosting requires approximately 2 µs, which is a long time, the charge pump circuit 28 is used mostly in the primary reading mode.

Figure 11:
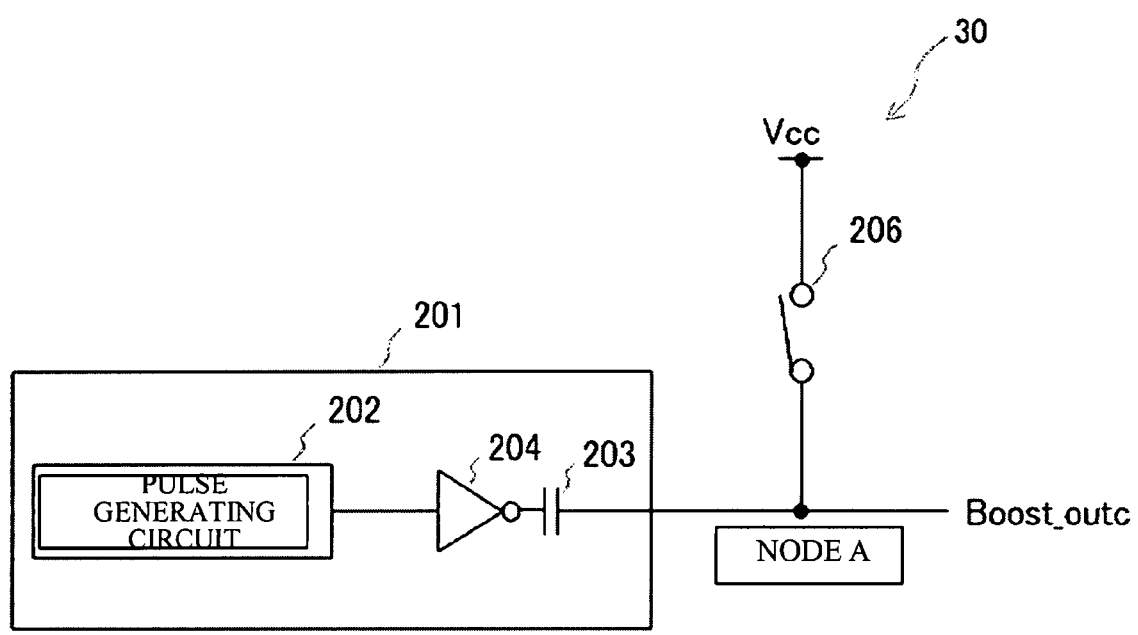
FIG. 11 is a circuit diagram of the booster circuit in accordance with an embodiment of the invention.

FIG. 11 illustrates the structure of the booster circuit 30 according to an embodiment of the invention. A pulse generating circuit 202 is coupled to a node A via an inverter 204 and a boosting capacitor 203. The node A is coupled to a power supply Vcc via a switch 206. When the switch 206 is switched on, the node A is charged by Vcc. When the node A is charged by Vcc, the switch 206 is opened to detach the node A from Vcc. Positive pulses are then generated from the pulse generating circuit 202 in the booster circuit 30. The positive pulses are inverted and amplified by the inverter 204, and are applied to the boosting capacitor 203. As one pulse of the positive pulses from the pulse generating circuit 202 is applied to the boosting capacitor 203, the node A is boosted to a level that is higher than Vcc by virtue of the capacitance coupling of the boosting capacitor 203. The boosted voltage is Boost_outc. The booster circuit 30 boosts the performances of the pulse generating circuit 202 that drives the boosting capacitor 203, and the inverter 204. As the time required for the boosting is approximately 20 ns, which is a short time, the booster circuit 30 is used mostly in the secondary reading mode.

Figure 12:
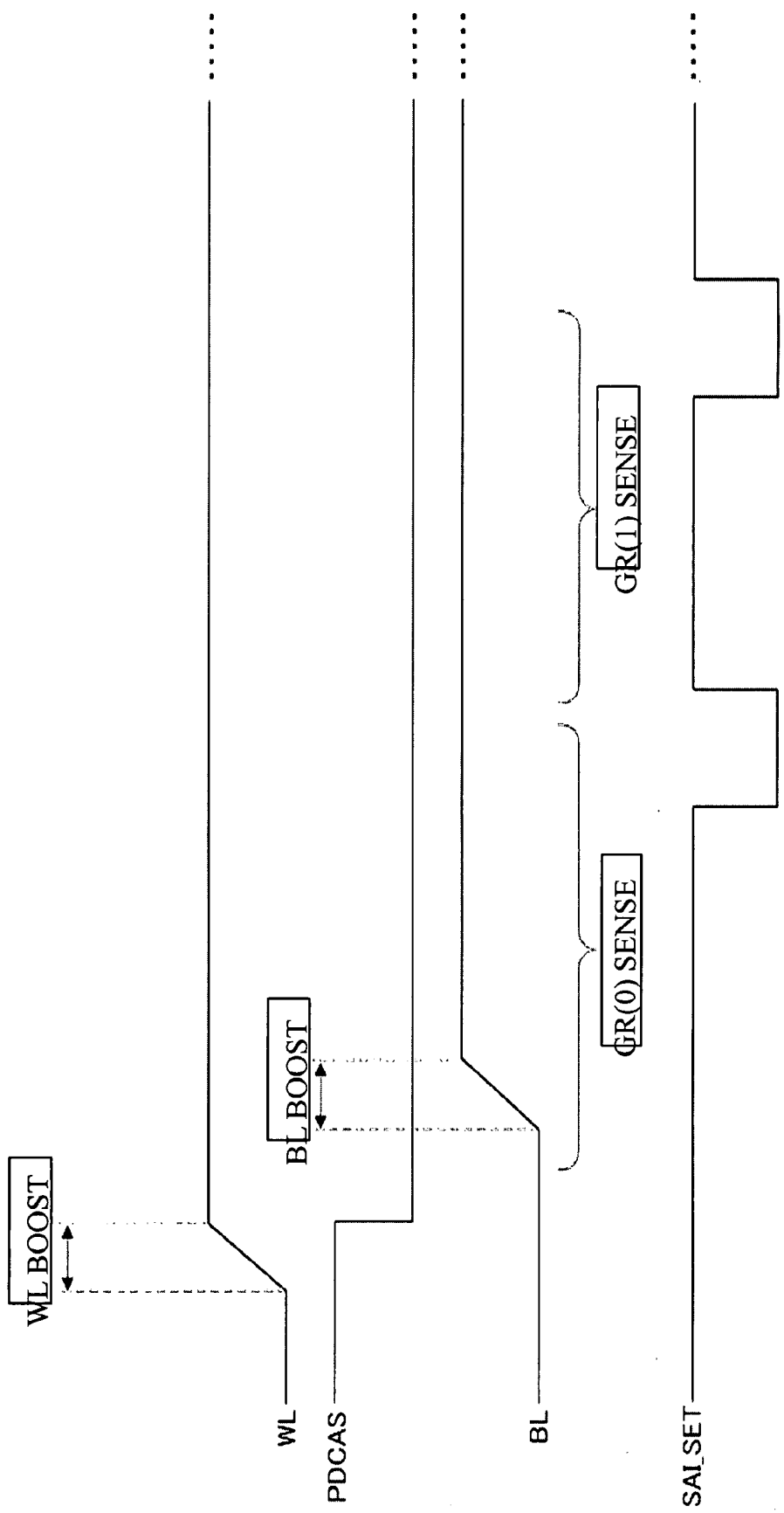
FIG. 12 is a timing chart in a case where data is read from a memory cell in accordance with an embodiment of the invention.

FIG. 12 is a timing chart of an operation to be performed when data is read from the memory cell 52 according to an embodiment of the invention. First, the word line WL is boosted by the X-dec_c 22. As shown in FIG. 9, in the primary reading mode, the voltage VppL generated from the charge pump circuit 28 is applied to the word line WL. In the secondary reading mode, the voltage VppH generated from the booster circuit 30 is applied to the word line WL. The word line WL is boosted by the booster circuit 30 in the secondary reading mode, so that the word line WL can be boosted at a high speed. Accordingly, in the secondary reading mode, the word line WL is boosted at a high speed.

As the word line WL is boosted, PDCAS is switched to the low level. As a result, the differential amplifier circuit 99 of the cascode circuit 70 shown in FIG. 4 is activated to precharge the bit line BL via DATAB. Here, in the secondary reading mode, the FET 78 that is a current source for the differential amplifier circuit 99 supplies a high current. In this manner, the time required for differential amplifying can be made shorter than in the primary reading mode. Since the FET 73b shown in FIG. 4 is also switched on, the bit line BL can be precharged at a high speed. After the precharging is completed, SAI_SET is switched to the low level. The FETs 91a and 91b shown in FIG. 4 are then switched on, and the output SAI of the cascode circuit 70 is output. Here, as described above, in the secondary reading mode, the current of SAI can be made higher.

Figure 13:
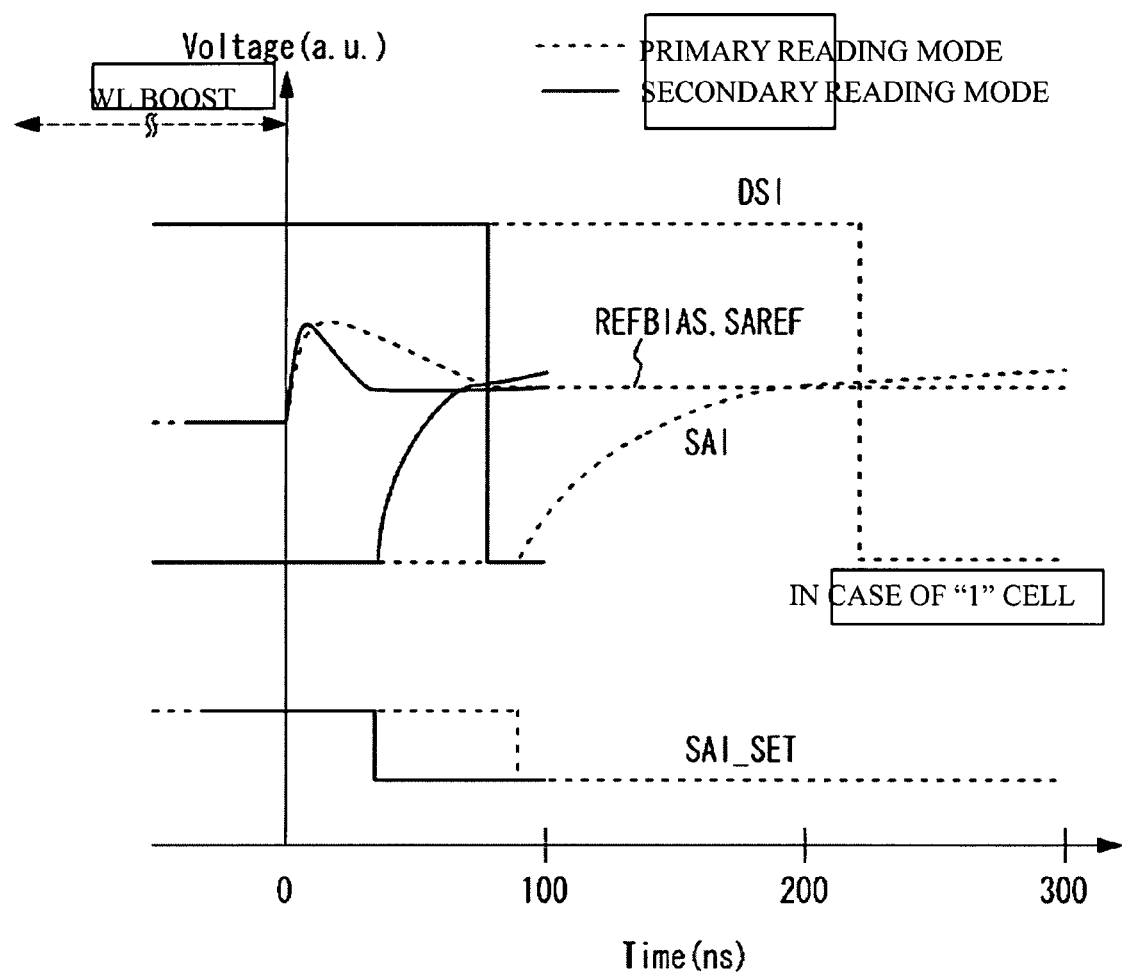
FIG. 13 shows the waveforms of REFBIAS, SAREF, SAI, and DSI both in the primary reading mode and the secondary reading mode in accordance with an embodiment of the invention.

FIG. 13 shows the waveforms of the outputs REFBIAS and SAREF of the reference cell cascode circuit 100, the output SAI of the cascode circuit 70, and the output DSI of the sense amplifier 160 after the boosting of the word line WL is completed according to an embodiment of the invention. In FIG. 13, the broken lines represent the waveforms in the primary reading mode, and the solid lines represent the waveforms in the secondary reading mode. When the boosting of the word line WL is completed, the reference cell cascode circuit 100 reads the currents flowing through the reference cells A and B. Here, the voltage applied to the word lines WL of the reference cells A and B in the secondary reading mode is higher than in the primary reading mode. Accordingly, the current flowing through the reference cells A and B can be made higher, so that REFBIAS and SAREF are stabilized in a short period of time. In this manner, the signal SAI_SET for letting SAI output from the cascode circuit 70 can be switched to the low level in an early stage. Since the current of the current source is high in the secondary reading mode, as described above, the output SAI of the cascode circuit 70 is stabilized in an early stage. After SAI is stabilized, the sense amplifier 160 performs sensing. The current of the current source for the sense amplifier 160 is high. In the secondary reading mode, the current of SAI is high. Because of those facts, the sense amplifier 160 can output the output DSI in an early stage. As shown in FIG. 13, after the word line WL is boosted, the time required for outputting DSI in the secondary reading mode is a half or less of the time required in the primary reading mode. In this manner, in the secondary reading mode, the data in the memory cell 52 can be read out at a high speed, though the current consumption increases.

Figure 14:
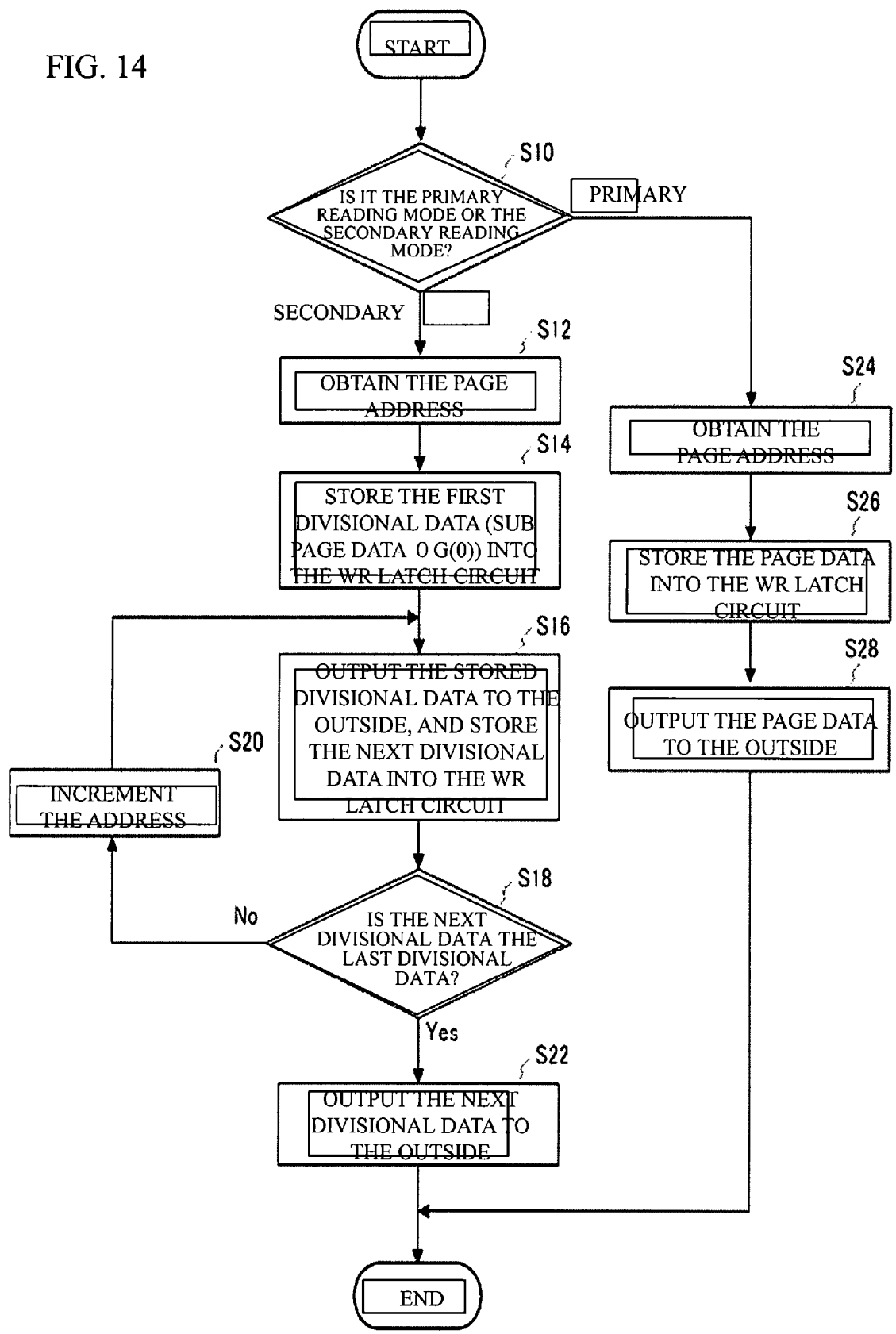
FIG. 14 is a flowchart of a control operation to be performed by the control circuit of the flash memory in accordance with the first embodiment of the invention.

Next, an operation to be performed by the control circuit 34 is described. FIG. 14 is a flowchart of a control operation to be performed by the control circuit 34 according to an embodiment of the invention. First, the control circuit 34 determines whether the reading mode is the primary reading mode or the secondary reading mode (step S10). In the case of the primary reading mode, the operation moves on to step S24. In the case of the secondary reading mode, the operation moves on to step S12.

Figure 15:
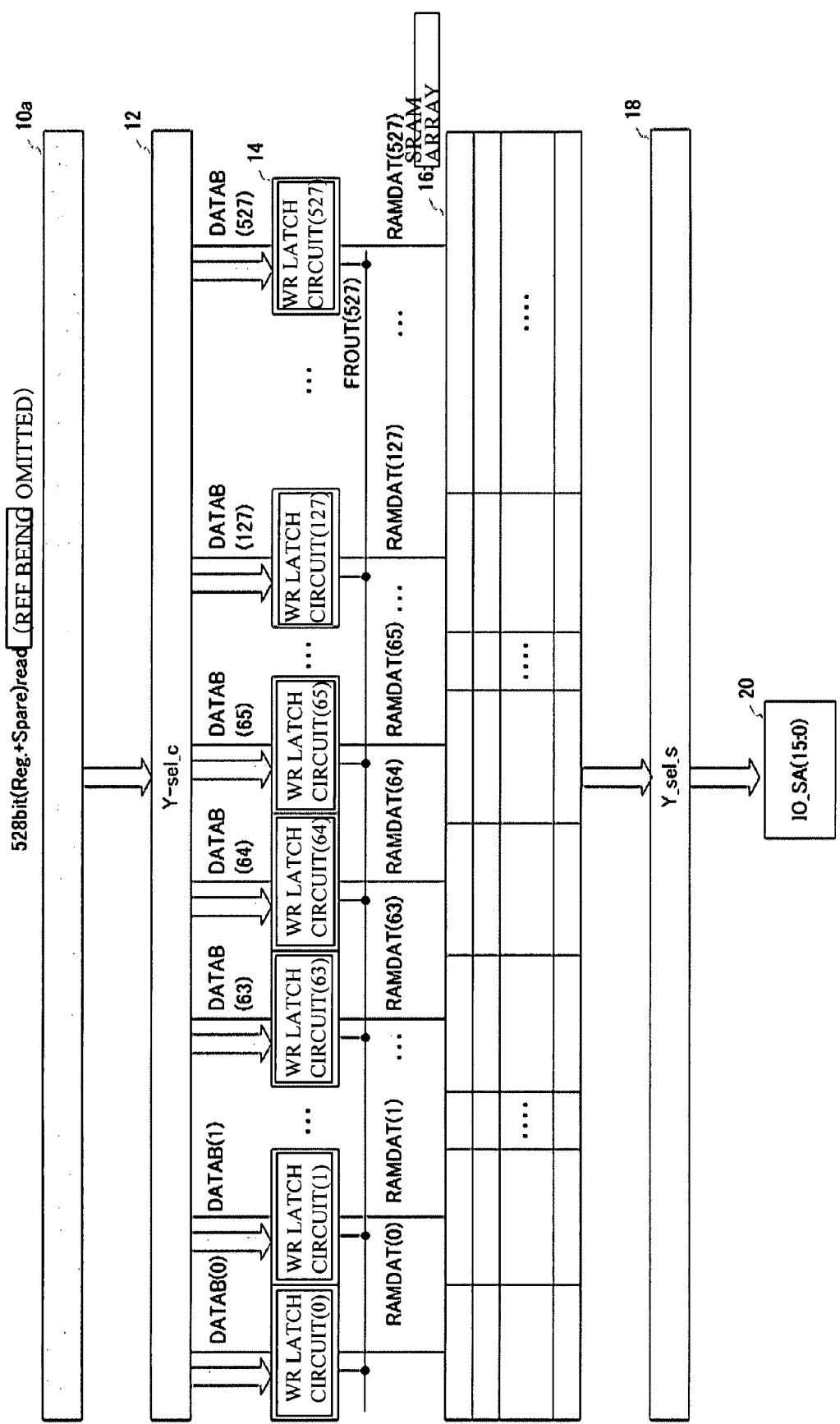
FIG. 15 shows the flow of data in a case where data is read from the memory cell array in the primary reading mode in accordance with an embodiment of the invention.

The case of the primary reading mode is first described. FIG. 15 shows the flow of data in a case where data is read from the memory cell array 10 in the primary reading mode according to an embodiment of the invention. In FIG. 15, reference numeral 10a indicates the data in one sub page in the memory cell array 10, and indicates the memory cells at one of the addresses 0 through 15 illustrated in FIG. 2. The area 10a is a 528-bits memory area. The address is selected by the Y-sel_c 12, and the 528-bit memory cells are coupled to 528 WR latch circuits (n) 14 via 528 of DATAB (n). The 528 WR latch circuits (n) 14 are coupled to the SRAM array 16 via 528 of RAMDAT (n). The SRAM array 16, the Y-sel_s 18, and the IO_SA(15:0) 20 has the same functions as those shown in FIG. 1, and explanation of them is omitted herein. The WR latch circuits (n) 14 are further coupled to FROUT. Page data (2 Kbytes) is divided into 32 pieces of sub page data 0 through 31. FIGS. 16A through 16E show the flow of data in a case where data is read from the memory cell array 10 in the primary reading mode. FIGS. 16A through 16E are schematic views of the memory areas of the memory cell array 10, the WR latch circuit 14 in the WR sense amplifier block 15, and the SRAM array 16 according to an embodiment of the invention. The memory cell array 10 contains more than one page, and outputs the data of a page k in the example case shown in FIGS. 16A through 16E. As described with reference to FIG. 2, the data of sub pages are scattered over the cell blocks. However, the data of sub pages are shown together in FIGS. 16A through 16E, for ease of explanation.

Figure 16A:
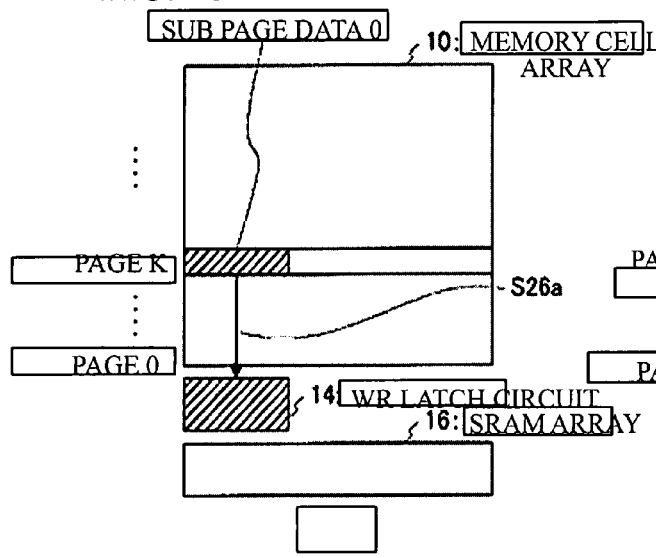
FIGS. 16A through 16E show the flow of data in a case where data is read from the memory cell array in the primary reading mode in accordance with an embodiment of the invention.
Figure 16B:
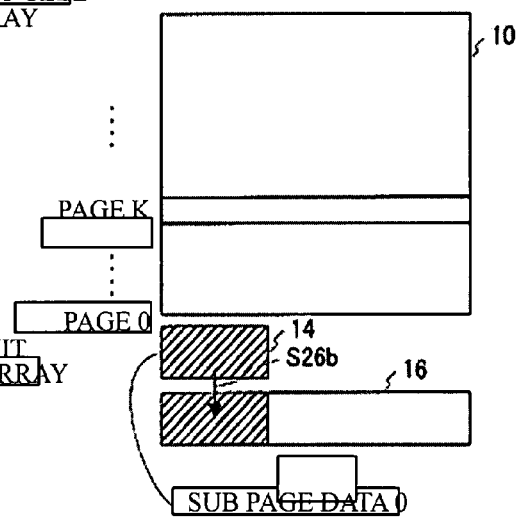
Figure 16C:
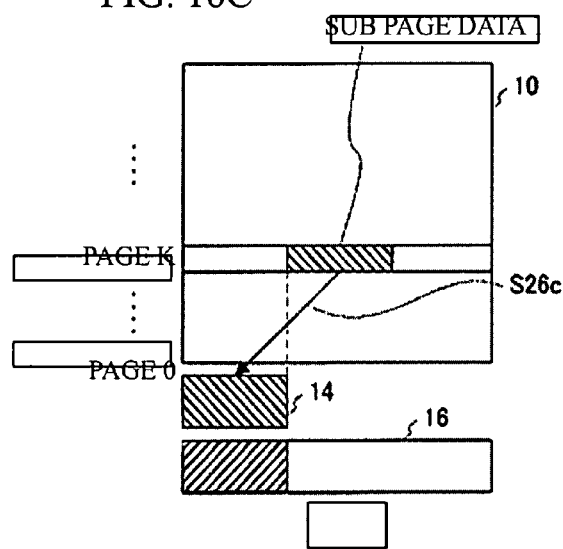
Figure 16D:
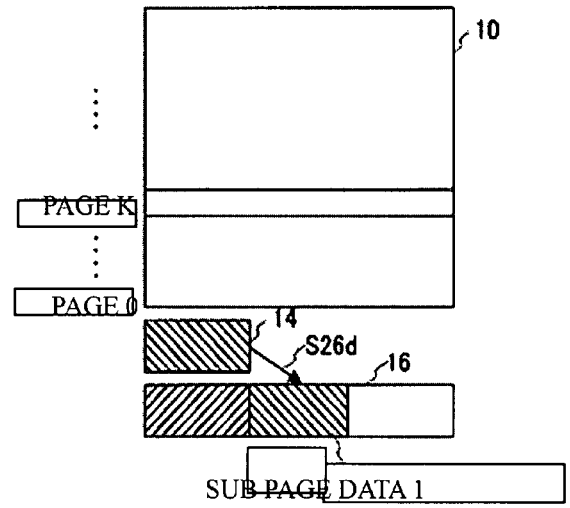
Figure 16E:
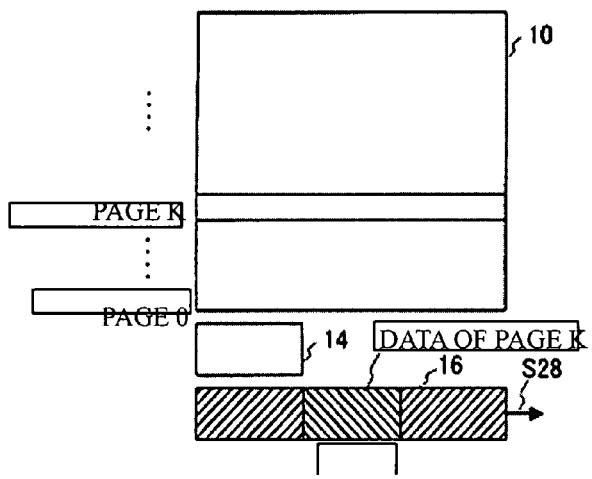

Referring back to FIG. 14, the control circuit 34 obtains the address of the page to be read (step S24). The control circuit 34 reads the first sub page data 0, and stores the sub page data 0 in the WR latch circuit 14 (step S26). As shown in FIG. 15, the data of each sub page (528 bits) of the page data (2 Kbytes) in the memory cell array 10a is stored in the WR latch circuit (n) 14 via DATAB (n). As shown in FIG. 16A, the first sub page data 0 from the memory cell array 10 is stored into the WR latch circuit 14 (step S26a). As shown in FIG. 16B, the sub page data 0 stored in the WR latch circuit 14 is then moved to the area for the sub page data 0 in the SRAM array 16 (step S26b). As shown in FIG. 16C, next sub page data 1 is transferred from the memory cell array 10 and is stored into the WR latch circuit 14 (step S26c). As shown in FIG. 16D, the sub page data 1 stored in the WR latch circuit 14 is then moved to the area for the sub page data 1 in the SRAM array 16 (step S26d). In this manner, the 32 pieces of the sub page data formed by dividing the page data by 32 are stored in the SRAM array 16. As shown in FIG. 14 and FIG. 16E, the page data is output from the SRAM array 16 to the outside via the IO_SA(15:0) (step S28). As shown in FIG. 14, the operation then comes to an end.

Figure 17:
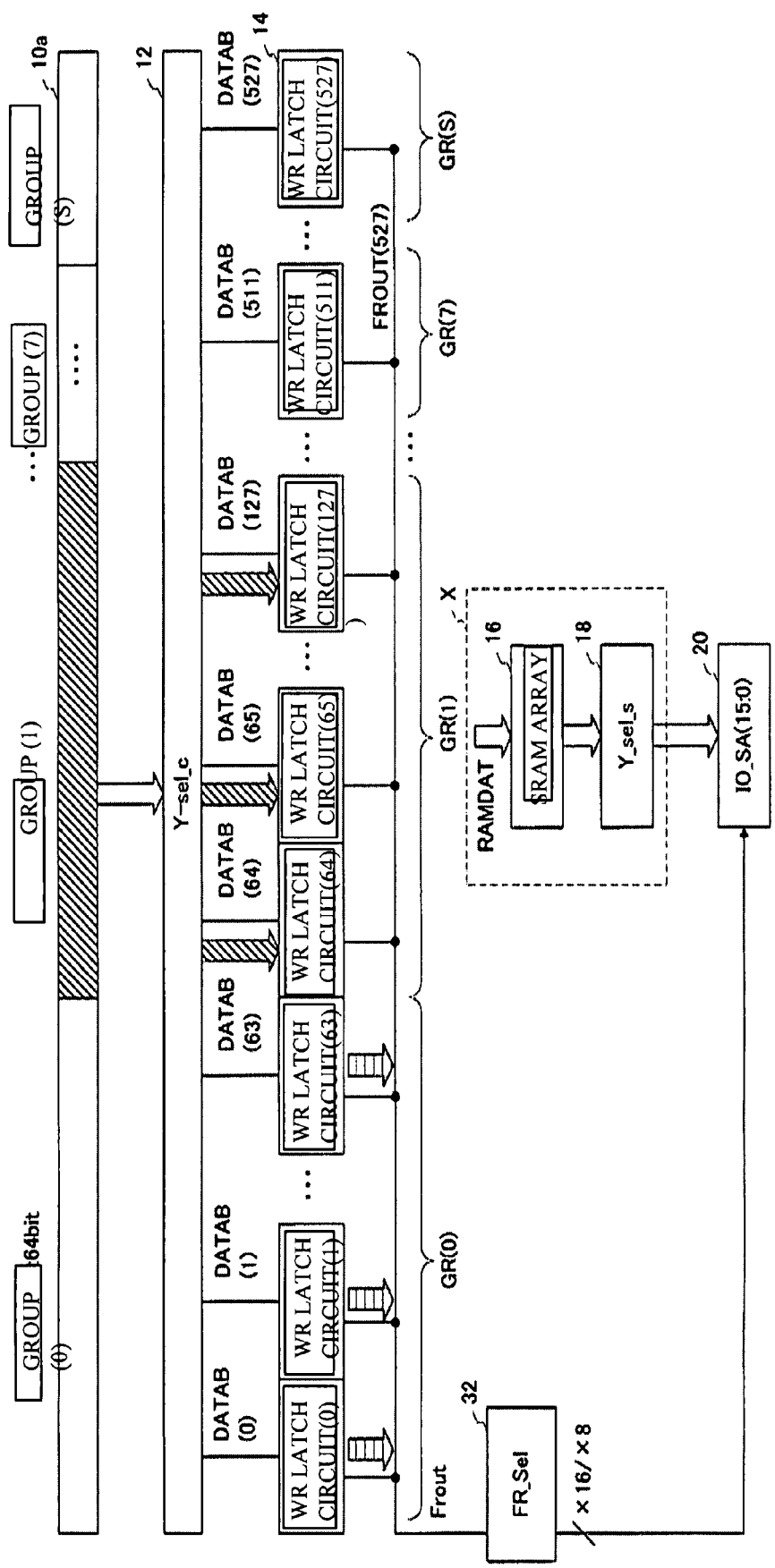
FIG. 17 shows the flow of data in a case where data is read from the memory cell array in the secondary reading mode in accordance with an embodiment of the invention.

Next, the operation to be performed by the control circuit 34 in the secondary reading mode is described. FIG. 17 and FIGS. 18A through 18E show the flow of data in a case where data is read from the memory cell array 10 in the secondary reading mode in accordance with an embodiment of the invention. FIG. 17 shows the same flow as that shown in FIG. 15, except that the 528-bit sub page data is divided into groups (0) through (7) each having 64 bits and a group (s) having 16-bit spare data. The data in the group (0) is transferred from the memory cell array 10a and is stored into the WR latch circuits (0) through (63) via DATAB (0) through (63). Likewise, the data in the group (1) is stored into the WR latch circuits (64) through (127) via DATAB (64) through (127). Thereafter, the data in the groups (2) through (7) and the data in the group (s) are stored in the same manner as above. The output from the WR latch circuit 14 is output via FROUT. The SRAM array 16 and the Y-sel_s 18 surrounded by the square X in FIG. 17 will be described later. In this manner, the groups (0) through (7) and (s) formed by further dividing the sub page data are referred to divisional data. FIGS. 18A through 18E show the same data flow as that shown in FIGS. 16A through 16E.

Figure 18A:
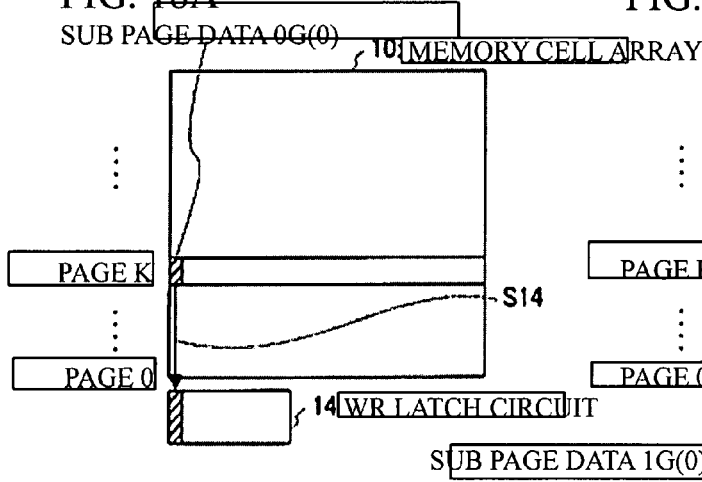
FIGS. 18A through 18E show the flow of data in a case where data is read from the memory cell array in the secondary reading mode in accordance with an embodiment of the invention.
Figure 18B:
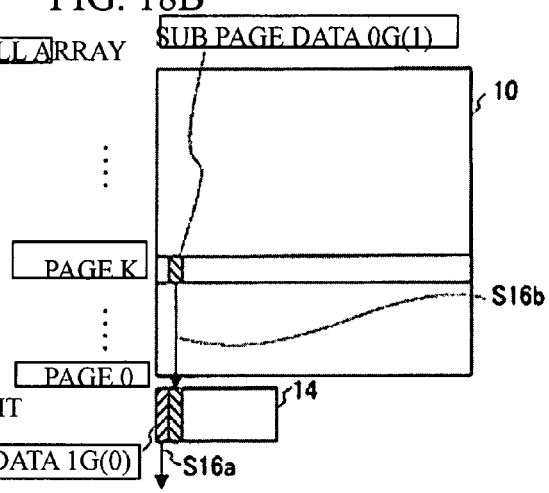

Referring back to FIG. 14, in the secondary reading mode, the control circuit 34 first obtains the address of the page to be read (step S112). As shown in FIG. 14 and FIG. 18A, sub page data 0G (0) as the first 64-bit divisional data (the divisional data in the group (0) of the sub page data 0) is read from the page data in the memory cell array 10, and is stored into the WR latch circuit 14 (step S14). As shown in FIG. 14 and FIG. 18B, the sub page data 0G (0) stored in the WR latch circuit 14 is then output to the outside (step S16a). Meanwhile, sub page data 0G (1) that is the next divisional data is transferred from the memory cell array 10 and is stored into the WR latch circuit 14 (step S16b). Referring to FIG. 17, the above described step S16 is described. The sub page data 0G (0) (the data in the group (0) of the sub page data 0) that is the divisional data stored in the 64 WR latch circuits (0) through (63) 14 is output to the IO_SA(15:0) 20 via FROUT and the FR_Sel 32. The sub page data 0G (0) is then output from the IO_SA(15:0) 20 to the outside. At the same time, the sub page data 0G (1) (the data in the group (1) of the sub page data 0) that is the next divisional data is transferred from the memory cell array 10a and is stored into the WR latch circuits (64) through (127) via DATAB (64) through (127).

Figure 18C:
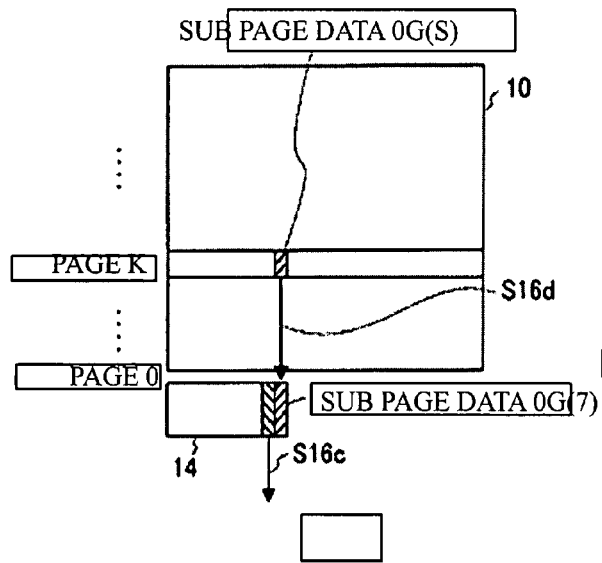
Figure 18D:
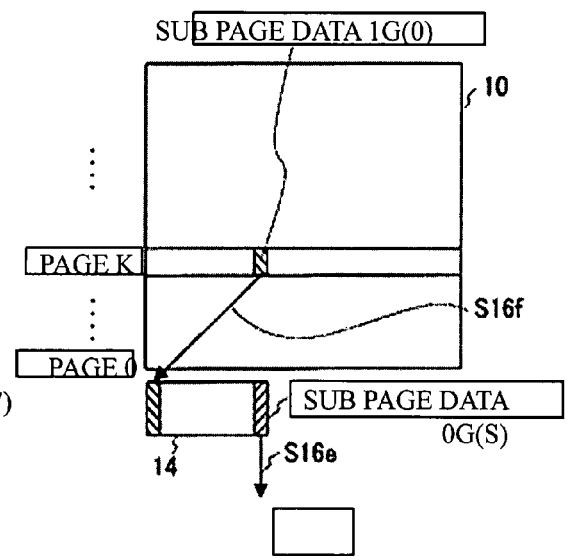
Figure 18E:
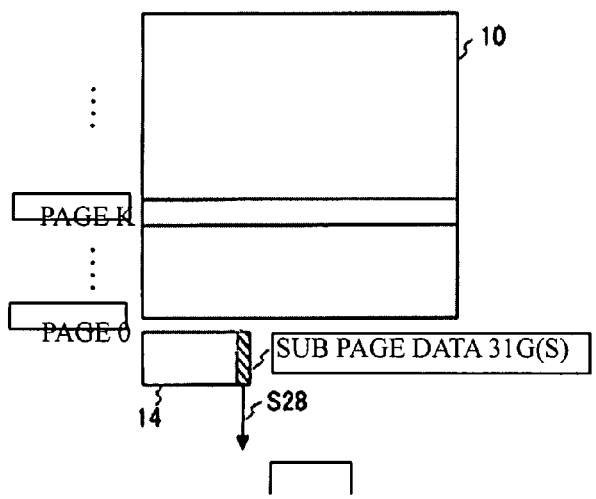

Referring back to FIG. 14, the control circuit 34 determines whether the sub page data 0G (1) as the next divisional data is the last divisional data of the page data (step S18). Since the sub page data 0G (1) is not the last divisional data, the address is incremented (step S20), and the operation returns to step S16. Thereafter, the divisional data of the sub page data 0 is successively output to the outside. The data flow between the sub page data 0 and the sub page data 1 is now described. As shown in FIG. 18C, sub page data 0G (7) stored in the WR latch circuit 14 is output to the outside (step S16c). During that time, sub page data 0G (s) is stored into the WR latch circuit 14 (step S16d). As shown in FIG. 18D, the sub page data 0G (s) is output from the WR latch circuit 14 to the outside (step S16e). During that time (step S16e), sub page data 1G (0) that is the first divisional data of the next sub page data is stored in to the WR latch circuit 14 (step S16f). As described above, between different sub page data pieces, the next divisional data is transferred from the memory cell array 10 and is stored into the WR latch circuit 14 while the subject divisional data is being output to the outside, in the same manner as in a case where divisional data in the same sub page data piece is stored. Referring back to FIG. 14, in step S18, if the next divisional data is the last divisional data, which is sub page data 31G (s), the operation moves on to step S22. As shown in FIG. 14 and FIG. 18E, the sub page data 31G (S9 that is the last divisional data stored in the WR latch circuit 14 is output to the outside. Here, the control circuit 34 has completed the operation.

In the above description, data is output from the WR latch circuit to the outside via FR_Sel in the secondary reading mode. In a modification, as shown in the square X in FIG. 17, data may be successively transferred from the WR latch circuit 14 and be stored into the SRAM array 16, while data is being output to the IO_SA(15:0) 20 via the FR_Sel 32. In this manner, page data that has once been output to the outside can be again output from the SRAM array 16 to the outside via the Y-sel_s 18 and the IO_SA(15:0) 20. Since the page data is stored in the SRAM array 16 at this point, the data can be again output, with the busy time being shortened.

Figure 19A:
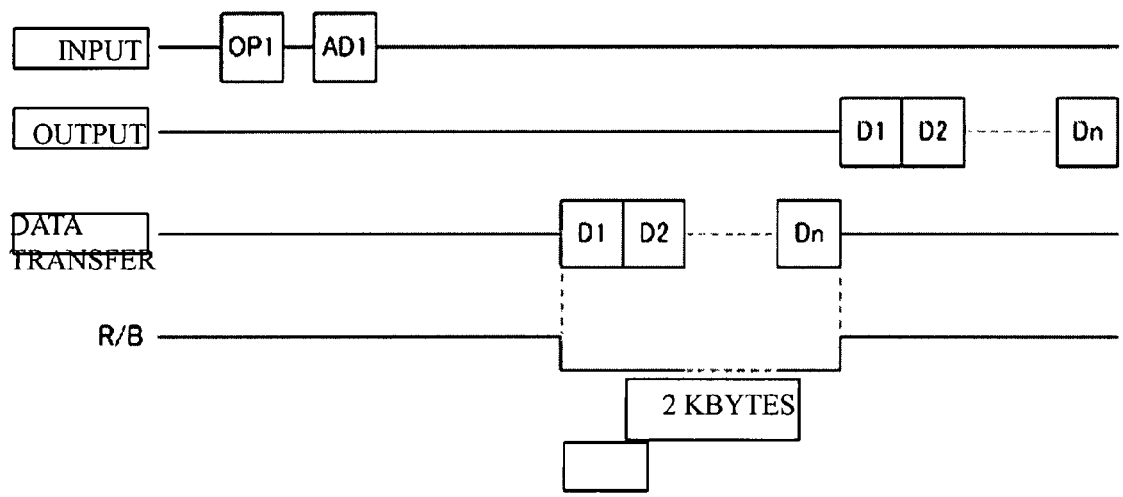
FIGS. 19A and 19B are schematic diagrams for explaining the difference in time required for outputting data from the memory cell array to the outside between the primary reading mode and the secondary reading mode in accordance with an embodiment of the invention.
Figure 19B:
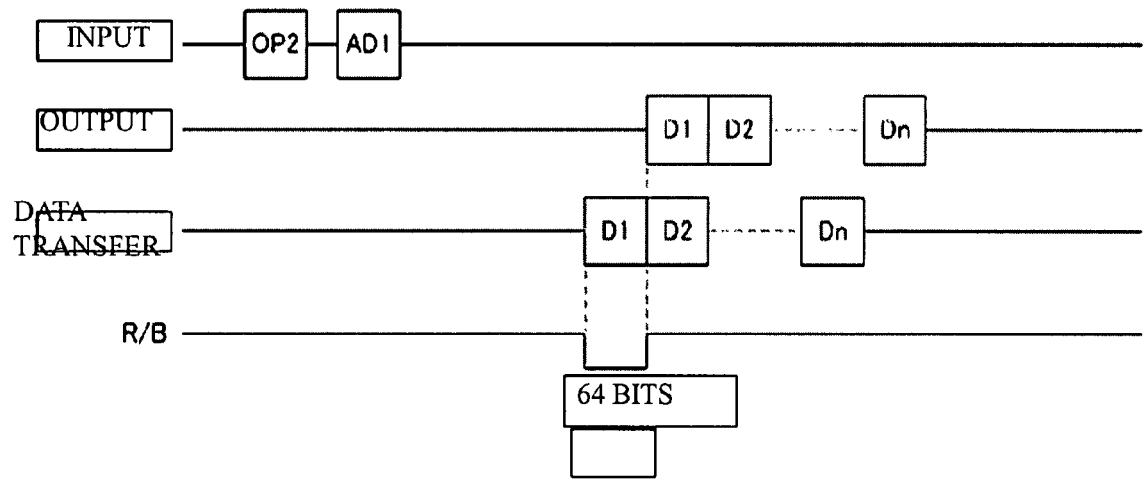

FIGS. 19A and 19B are schematic diagrams for explaining the difference in time required for outputting data from the memory cell array 10 to the outside between the primary reading mode and the secondary reading mode according to an embodiment of the invention. As shown in FIG. 19A, in the primary reading mode, "Input" represents a signal that is input to the flash memory, "Output" represents the data that is output from the flash memory or the IO_SA(15:0) 20, "Data transfer" represents the data to be transferred from the memory cell array 10 to the WR latch circuit 14, and "R/B" represents a read busy signal (indicating that the low level is in a busy state) that is sent from the outside. The abscissa axis indicates time. First, a command OP1 for selecting the primary reading mode is input. A page address AD1 is then input. The data D1 through Dn of one page (2 Kbytes) are transferred from the memory cell array 10 to the SRAM array 16. The time required for those procedures is the initial access time. The SRAM array 16 outputs the data D1 through Dn.

As shown in FIG. 19B, in the secondary reading mode, a command OP2 for selecting the secondary reading mode is input. A page address AD1 is then input. The first divisional data D1 (the sub page data 0G (0)) of the data of one page (2 Kbytes) is transferred from the memory cell array 10 to the WR latch circuit 14. The time required for those procedures is the initial access time. While the divisional data D1 (the sub page data 0G (0)) is being output from the WR latch circuit 14, the next divisional data D2 (the sub page data 0G (1)) is transferred from the memory cell array 10 to the WR latch circuit 14. In this manner, the data output is performed until the data Dn is output. In the secondary mode, the next divisional data is transferred from the memory cell array 10 to the WR latch circuit 14 while the subject divisional data is being output to the outside. Accordingly, the initial access time can be made shorter. In other words, the time in the read busy state can be made shorter, and the time required for outputting data from the flash memory can be shortened.

In the first embodiment, the control circuit 34 causes the WR latch circuit 14 (the first storage unit) to store page data (area data) transferred from the memory cell array 10, and then selects the reading mode between the primary reading mode for outputting the stored page data to the outside and the secondary reading mode in which the divisional data of the page data are transferred from the memory cell array 10 and are stored into the WR latch circuit 14, and the stored divisional data are output to the outside. In the primary reading mode, all the page data is read from the memory cell array 10, and is output to the outside after stored in the SRAM array 16 via the WR latch circuit 14, as in a NAND flash memory. Accordingly, the initial access time in the primary reading mode is the same as that in a NAND flash memory. In the secondary reading mode, on the other hand, the page data is divided into divisional data, and the divisional data are successively output to the outside after transferred from the memory cell array 10 to the WR latch circuit 14. The divisional data can be output to the outside before all the page data is read out in the memory device. Accordingly, the initial access time is shortened. In the first embodiment, the page data is output in the secondary reading mode. However, it is also possible to output the data in one sub page data (528 bits) or the data in cell blocks (16 bits) in the secondary reading mode. In this manner, necessary data can be read out at a higher speed. As described above, in one flash memory, the reading mode can be chosen between the secondary reading mode for processing data at a high speed and the primary reading mode for processing a large amount of data with smaller power consumption.

Also, as in step S16, in the secondary reading mode, while outputting one piece of divisional data (the first divisional data) of more than one piece of divisional data to the outside, the control circuit 34 stores the next divisional data (the second divisional data) of the more than one piece of divisional data from the memory cell array 10 into the WR latch circuit 14. In this manner, the time required for outputting data from the flash memory in the secondary reading mode can be shortened, as described with reference to FIGS. 19A and 19B.

Further, as described with reference to FIG. 13, the time required for transferring the divisional data from the memory cell array 10 to the WR latch circuit 14 in the secondary reading mode is shorter than the time required for transferring data from the memory cell array 10 to the WR latch circuit 14 in the primary reading mode. Accordingly, the time required for transferring the first divisional data D1 shown in FIG. 19B can be shortened. Further, while the divisional data is being output from the WR latch circuit 14 to the outside, the next divisional data can be transferred from the memory cell array 10 to the WR latch circuit 14. In this manner, the time required for outputting data from the flash memory in the secondary reading mode can be further shortened.

Furthermore, the flash memory in accordance with the first embodiment has the charge pump circuit 28 or the booster circuit 30 (the high-voltage generating circuit) generating voltages to be applied to the word lines WL of the memory cell array 10, so as to read data from the memory cell array 10. In the secondary reading mode, the charge pump circuit 28 or the booster circuit 30 generates a higher voltage than in the primary reading mode. As shown in FIG. 9, the X-dec_c 22 applies the voltage VppL to the word lines WL in the primary reading mode, and applies the voltage VppH, which is higher than VppL, to the word lines WL in the secondary reading mode. Accordingly, in the secondary reading mode, the current flowing through the memory cells 52 and the reference cells A and B can be made higher, and the output SAI of the cascode circuit 70 and the outputs REFBIAS and SAREF of the reference cell cascode circuit 100 can be stabilized in a short time. In this manner, the time required for transferring data from the memory cell array 10 to the WR latch circuit 14 in the secondary reading mode can be shortened. As a result, the time required for outputting data from the flash memory can be made even shorter. Also, since the booster circuit 30 is designed to boost the word lines WL at a high speed upon receipt of one pulse, the time required for outputting data in the secondary reading mode can be shortened.

The flash memory in accordance with the first embodiment further includes the cascode circuit 70 and the sense amplifier 160 (the read circuit) for reading data from the memory cell array 10. In the secondary reading mode, the currents of the current sources, such as the current source FET 78 of the differential amplifier circuit 99 of the cascode circuit 70 shown in FIG. 4 and the current source FET 168 of the differential amplifier circuit 175 of the sense amplifier 160 shown in FIG. 7, are made higher than in the primary reading mode. The current for precharging the bit lines BL, such as the FET 73b of the cascode circuit 70, is also made higher. Further, the current of the output SAI of the cascode circuit 70 is made higher. Accordingly, in the secondary reading mode, the cascode circuit 70 and the sense amplifier 160 read data from the memory cell array 10 with larger current consumption than in the primary reading mode. In this manner, the time required for transferring data from the memory cell array 10 to the WR latch circuit 14 in the secondary reading mode can be shortened. Thus, the time required for outputting data from the flash memory can be made even shorter.

As shown in FIG. 4, the flash memory in accordance with the first embodiment includes the FET 73a (a transistor) that controls the current to be supplied to the bit line BL (DATAB) coupled to the memory cell from which data is to be read out. The FET 73a is switched on in the secondary reading mode, and supplies a higher current to the bit line BL than in the primary reading mode. In this manner, in the secondary reading mode, the bit lines BL can be precharged at a high speed.

The flash memory in accordance with the first embodiment also includes the differential amplifier circuit 99 (the first comparator circuit) that compares the voltage DATAB of a bit line BL with the reference voltage CASREF. In the secondary reading mode, the current source FET (a transistor) 78 provided for the differential amplifier circuit 99 supplies a higher current to the differential amplifier circuit 99 than in the primary reading mode. Accordingly, in the secondary reading mode, the bit lines BL can be precharged at a high speed.

As shown in FIG. 7, the flash memory in accordance with the first embodiment further includes the differential amplifier circuit 175 and the amplifier circuit 176 (the second comparator circuit) that compare the signal SAI representing the current of the memory cell of the memory cell array 10 from which data is to be read out with the signal SAREF representing the current flowing through the reference cell to be compared with the current flowing through the memory cell. In the secondary reading mode, the current source FETs (transistors) 168 and 169 provided for the differential amplifier circuit 175 and the amplifier circuit 176 supplies higher currents to the differential amplifier circuit 175 and the amplifier circuit 176 than in the primary reading mode. Accordingly, the current flowing through a memory cell can be compared with the current flowing through the reference cell at a high speed.

The flash memory in accordance with the first embodiment further includes the SRAM array 16 (the second storage unit)

that stores page data stored in the WR latch circuit 14 and then outputs the page data to the outside in the primary reading mode.

As shown in FIG. 8, the flash memory in accordance with the first embodiment further includes the switch 186 that transfers page data from the WR latch circuit 14 to the SRAM array 16 in the primary reading mode, and outputs divisional data from the WR latch circuit 14 to the outside, not letting the divisional data pass through the SRAM array 16, in the secondary reading mode. With the switch 186, it is not necessary to output data via the SRAM array 16, and the data can be output at a higher speed.

Further, as in the modification shown in the square X in FIG. 17, the switch 186 in the secondary reading mode can transfer divisional data to the SRAM array 16, while outputting divisional data from the WR latch circuit 14 to the outside without the SRAM array 16.

In the secondary reading mode, the time required for outputting divisional data from the WR latch circuit 14 to the outside should preferably be longer than the time required for transferring divisional data from the memory cell array 10 to the WR latch circuit 14. Therefore, the time required for transferring the first divisional data from the memory cell array 10 to the WR latch circuit 14 may be made shorter than the time required for transferring each piece of the other divisional data from the memory cell array 10 to the WR latch circuit 14. In this manner, the time required for transferring the first divisional data is made shorter while the other divisional data are transferred at a lower speed, so as to reduce the power consumption in the secondary reading mode.

A second embodiment of the present invention is an example of a flash memory that is the same as the flash memory of the first embodiment, except that the flash memory of the second embodiment also operates in a copy back mode. For the copy back mode, the spare data contains flag data that is used for determining the validity of page data. First, the spare data among the data on one page is output to the outside. An external CPU or the like then determines the validity of the page data. If the page data is valid, the page data is copied in another page in accordance with an instruction from the outside. The second embodiment is an example case where, in the copy back mode, the spare data is output to the outside in the secondary reading mode. Here, pieces of data formed by dividing the spare data in page data are referred to as divisional spare data.

Figure 20A:
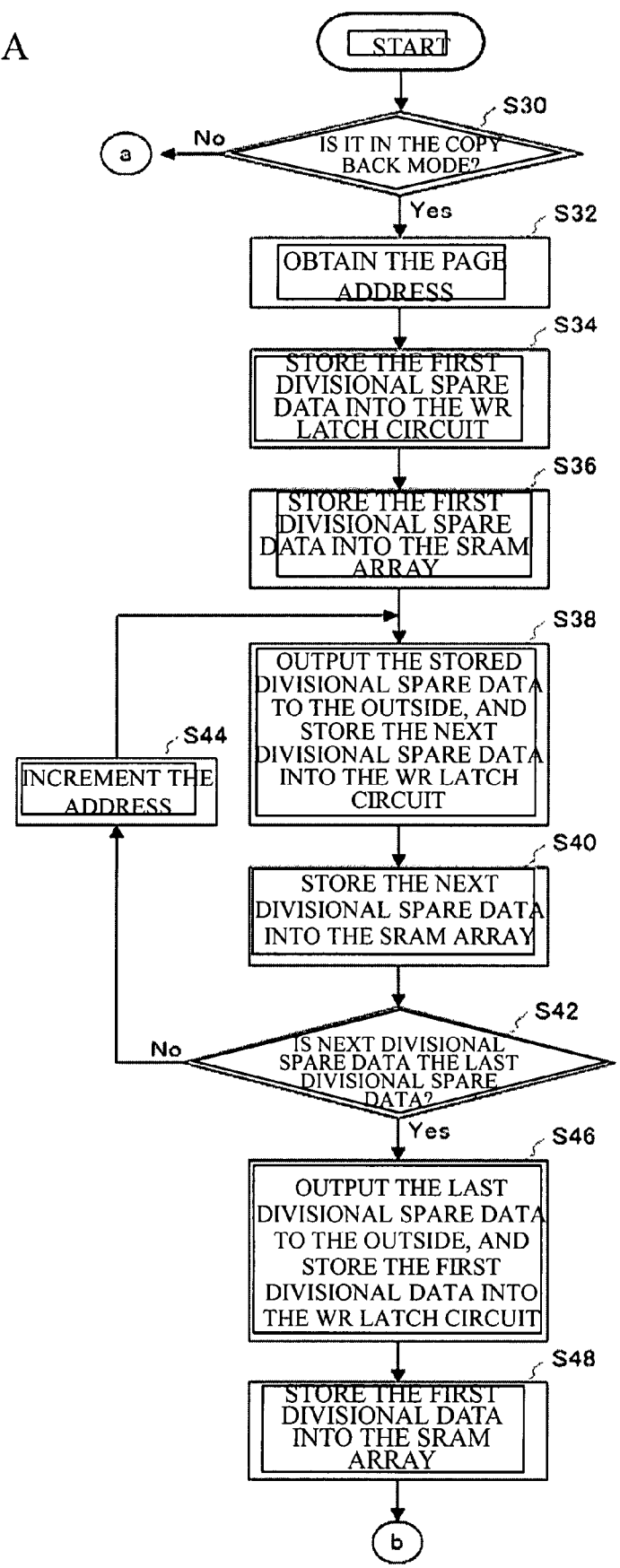
FIGS. 20A and 20B show a flowchart of a control operation to be performed by the control circuit of a flash memory in accordance with a second embodiment of the present invention.
Figure 20B:
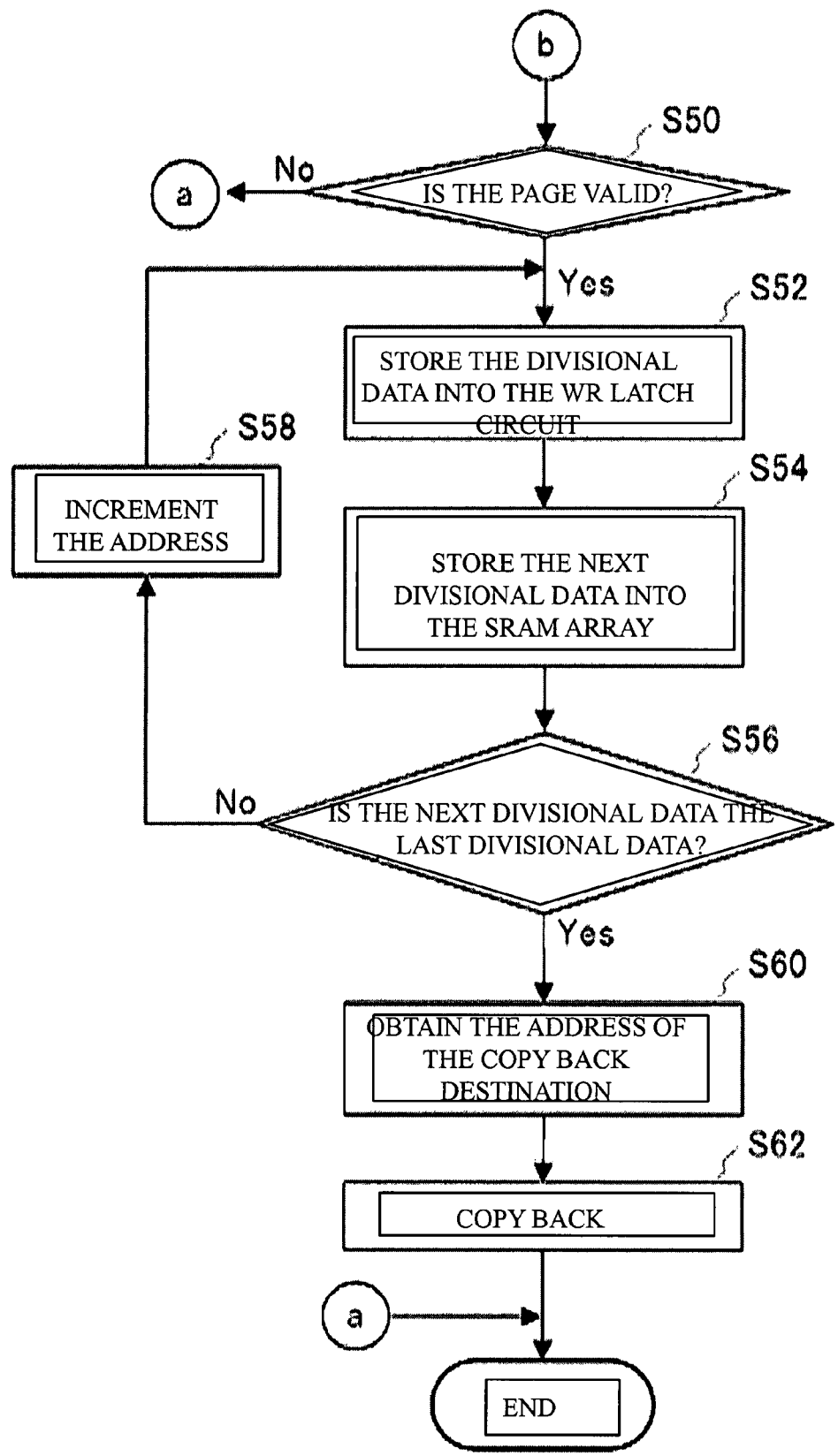

An operation to be performed by the control circuit 34 of the second embodiment is now described. FIGS. 20A and 20B show a flowchart of the operation to be performed by the control circuit 34 in accordance with the second embodiment of the invention. FIGS. 16A through 16E, FIGS. 21A through 21E show the flow of data in a case where data is read out in the copy back mode in accordance with an embodiment of the invention. In the example case shown in FIGS. 21A and 21E, a page k is to be copied back on a page x among the pages in the memory cell array 10. As shown in FIGS. 20A and 20B, the control circuit 34 first determines whether the operating mode is the copy back mode (step S30). If the operating mode is not the copy back mode, the control circuit 34 ends the operation. If the operating mode is the copy back mode, the control circuit 34 obtains the address of the page to be copied back (step S32). As shown in FIGS. 20A and 20B and FIG. 21A, 16-bit sub page data 0G (s) that is the first divisional spare data of one page of the page k is transferred from the memory cell array 10 and is stored into the WR latch circuit 14 (step S34). The sub page data 0G (s) is then transferred from the WR latch circuit 14 and is stored into the SRAM array 16 (step S36).

As shown in FIGS. 20A and 20B and FIG. 21B, the sub page data 0G (s) stored in the SRAM array 16 is then output to the outside (step S38a). During that time, the sub page data 1G (s) that is the next divisional spare data is transferred from the memory cell array 10 and is stored into the WR latch circuit 14 (step S38b). The sub page data 1G (s) is then transferred from the WR latch circuit 14 and is stored into the SRAM array 16 (step S40). Referring back to FIGS. 20A and 20B, the control circuit 34 determines whether the next divisional spare data (the sub page data 1G (s)) is the last divisional spare data (step S42). If the next divisional spare data is not the last divisional spare data, the address is incremented (step S44), and the operation returns to step S38. In this manner, the spare data of the page data is output to the outside. If the next divisional spare data is determined to be the last divisional spare data in step S42, the operation moves on to step S46. As shown in FIGS. 20A and 20B and FIG. 21C, sub page data 31G (s) that is the last divisional spare data stored in the SRAM array 16 is output to the outside (step S46a). During that time, the sub page data 0G (0) that is the first divisional data of the page k is transferred from the memory cell array 10 and is stored into the WR latch circuit 14 (step S46b). The sub page data 0G (0) is then transferred from the WR latch circuit 14 and is stored into the SRAM array 16 (step S48).

Referring back to FIGS. 20A and 20B, the result of the determination made on the data validity by an external CPU or the like is then input. Based on the result, the control circuit 34 determines the validity of the data on the page k (step S50). If the data on the page k is not valid, the control circuit 34 ends the operation. If the data on the page k is valid, the operation moves on to step S52. As shown in FIGS. 20A and 20B and FIG. 21D, in step S52, the sub page data 0G (1) that is the next divisional data is transferred from the memory cell array 10 and is stored into the WR latch circuit 14 (step S52). The sub page data 0G (1) is then transferred from the WR latch circuit 14 and is stored into the SRAM array 16 (step S54). As shown in FIGS. 20A and 20B, the control circuit 34 then determines whether the sub page data stored in step S54 is the last divisional data of the page k (step S56). If the sub page data is not the last divisional data, the address is incremented (step S58), and the operation returns to step S52. In this manner, the page data on the page k are divided into divisional data and stored in the SRAM array 16. If the sub page data is determined to be the last divisional data in step S56, the page data on the page k is already stored in the SRAM array 16. The control circuit 34 obtains the address of the page into which the page data is to be copied (step S60). As shown in FIGS. 20A and 20B and FIG. 21E, the data stored in the SRAM array 16 is copied on the page x in the memory cell array 10 (step S62). Here, the operation of copying data from the page k into the page x in the memory cell array 10 is completed. The control circuit 34 then ends the operation.

The flash memory in accordance with the second embodiment can perform the copy back operation of writing page data into another page after storing the page data in the WR latch circuit 14 or the SRAM array 16. Also, each page has a spare area for storing the spare data containing the flag data to be used for determining the validity of the page data (area data). As in step S38a shown in FIGS. 20A and 20B and FIG. 21B, in the copy back operation, the control circuit 34 outputs a part of the spare data containing the flag data to the outside. Accordingly, the validity of the page data can be determined from the outside.

As in step S38 in FIGS. 20A and 20B and FIG. 21B, while outputting the sub page data 0 (s) (the first divisional spare data) that is a piece of divisional spare data among pieces of divisional spare data to the outside, the control circuit 34 stores the sub page data 1 (s) (the second divisional spare data) that is the next divisional spare data among the pieces of divisional spare data from the memory cell array 10 into the WR latch circuit 14. Accordingly, in the copy back mode, the time required for outputting the spare data can be shortened.

Further, as in step S46 in FIGS. 20A and 20B and FIG. 21C, while outputting the sub page data 31G (s) that is the last divisional spare data among the pieces of divisional spare data to the outside, the control circuit 34 stores the sub page data 0G (0) that is the first divisional data in the page data (area data) of the page k from the memory cell array 10 into the WR latch circuit 14. Accordingly, in the copy back mode, the time required for storing the sub page data 0G (0) into the WR latch circuit 14 can be shortened.

A third embodiment of the present invention is an example case where the spare data of continuous pages in a block to be copied back are successively output to the outside in the copy back mode.

An operation to be performed by the control circuit 34 in accordance with the third embodiment is now described. FIG. 22 is a flowchart of the operation to be performed by the control circuit 34 in accordance with the third embodiment of the invention. Like FIGS. 21A through 21E, FIGS. 23A through 23D show the flow of data in a case where data is read out in the copy back mode according to an embodiment of the invention. In the case shown in FIGS. 23A through 23D, a block containing page k through page 1 among the pages stored in the memory cell array 10 is to be copied back. Referring now to FIG. 22, the control circuit 34 first determines whether the operating mode is the copy back mode (step S70). If the operating mode is not the copy back mode, the control circuit 34 ends the operation. If the operation mode is the copy back mode, the control circuit 34 obtains the address of the block to be copied back (step S72). As shown in FIG. 22 and FIG. 23A, the 16-bit sub page data 0G (s) that is the first divisional spare data among the spare data of the page k through the page 1 is transferred from the memory cell array 10 and is stored into the WR latch circuit 14 (step S74). The sub page data 0G (s) is then transferred from the WR latch circuit 14 and is stored into the SRAM array 16 (step S76).

As shown in FIG. 22 and FIG. 23B, the sub page data 0G (s) stored in the SRAM array 16 is output to the outside (step S78a). During that time, the sub page data 1G (s) that is the next divisional spare data is transferred from the memory cell array 10 and is stored into the WR latch circuit 14 (step S78b). The sub page data 1G (s) is then transferred from the WR latch circuit 14 and is stored into the SRAM array 16 (step S80). Referring back to FIG. 22, the control circuit 34 determines whether the next divisional spare data (the sub page data 1G (s)) is the last divisional spare data of the page k (step S82). If the next divisional spare data is not the last divisional spare data, the address is incremented (step S84), and the operation returns to step S78. If the next divisional spare data is the last divisional spare data, the operation moves on to step S86. In this manner, the spare data of one page is output.

As shown in FIG. 22 and FIG. 23C, the sub page data 31G (s) that is the last divisional spare data of the page k is in the SRAM array 16. In step S86, the control circuit 34 determines whether the current page is the last page. If the current page is not the last page, the operation moves on to step S88. The sub page data 31G (s) is output from the SRAM array 16 to the outside (step S88a). During that time, the sub page data 0G (s) that is the first divisional spare data of the next page k+1 is transferred from the memory cell array 10 and is stored into the WR latch circuit 14 (step S88b). As shown in FIG. 22, the address of the page is incremented (step S90), and the operation returns to step S76. In this manner, the spare data of the page k through the page 1 in the block are output to the outside.

If the current page is determined to the last page 1 in step S86, the operation moves on to step S92. As shown in FIGS. 22 and 23D, the sub page data 31G (s) of the page 1 that is the last divisional spare data of the last page in the SRAM array 16 is output from the SRAM array 16 to the outside (step S92).

In the above manner, the spare data of the page k through the page 1 in the memory cell array 10 are output to the outside. The copy back operation is performed by transferring the data determined to be valid by an external circuit from the WR latch circuit 14 and storing the data into the SRAM array 16 in the primary reading mode of the first embodiment or in the same manner as in the second embodiment, and then copying the data into the page that is the copy back destination. The operation of the control circuit 34 is thus completed.

In accordance with the third embodiment, as in step S88 in FIG. 22 and FIG. 23C, while outputting the sub page data 31G (s) (the first divisional spare data) of the page k that is the last divisional spare data of one piece of spare data among pieces of spare data, the control circuit 34 stores the sub page data 0G (s) (the second divisional spare data) of the page k+1, which is the first divisional spare data of the page k+1 different from the page k, into the WR latch circuit 14. Accordingly, in the copy back mode, the time required for outputting the spare data can be shortened.

A fourth embodiment of the present invention is an example case where the data indicating the validity of subject pages (the flag data) among the spare data of the pages contained in the block to be copied back are successively output to the outside.

Figure 24:
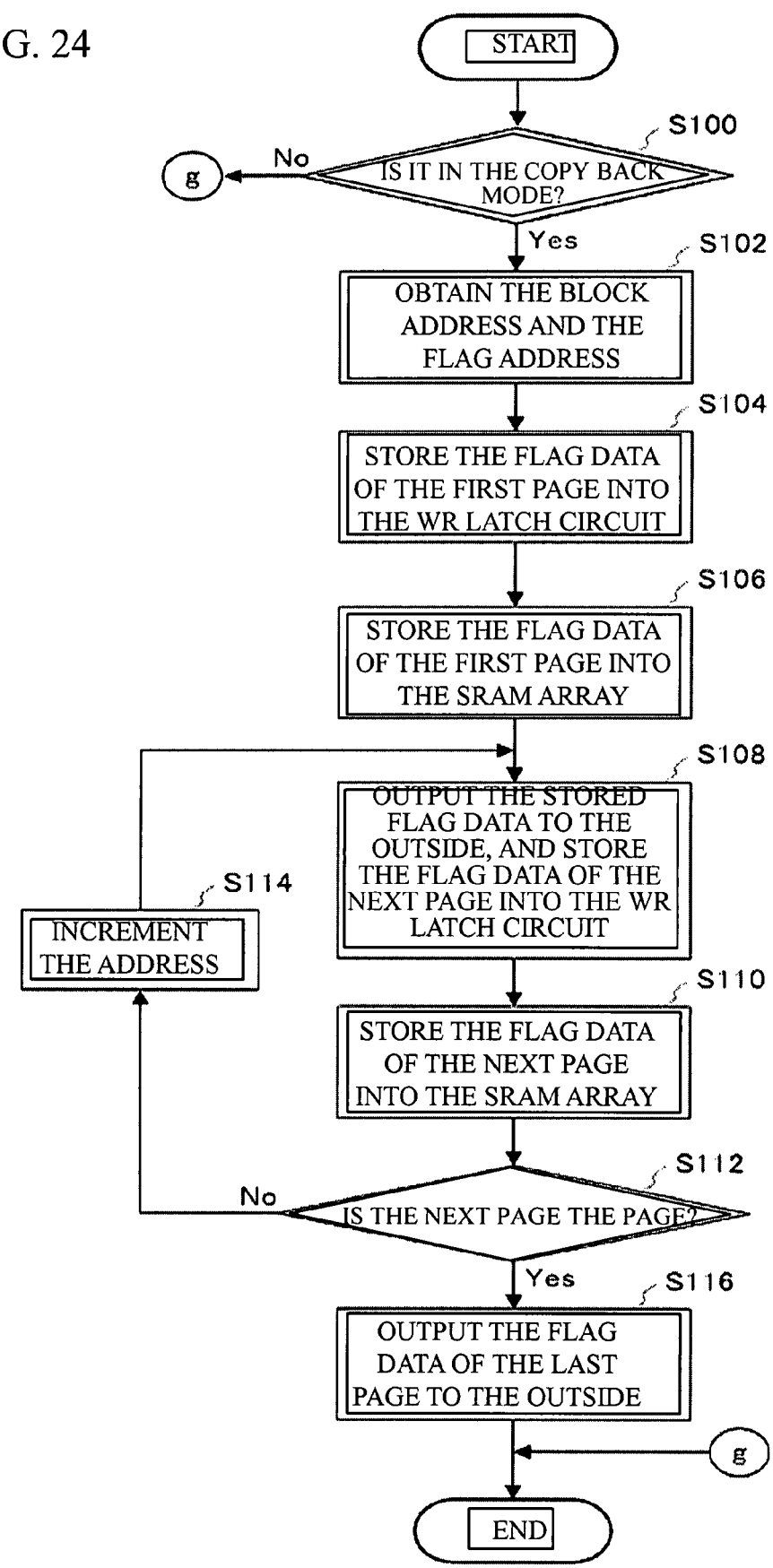
FIG. 24 is a flowchart of a control operation to be performed by the control circuit of a flash memory in accordance with a fourth embodiment of the present invention.
Figure 25A:
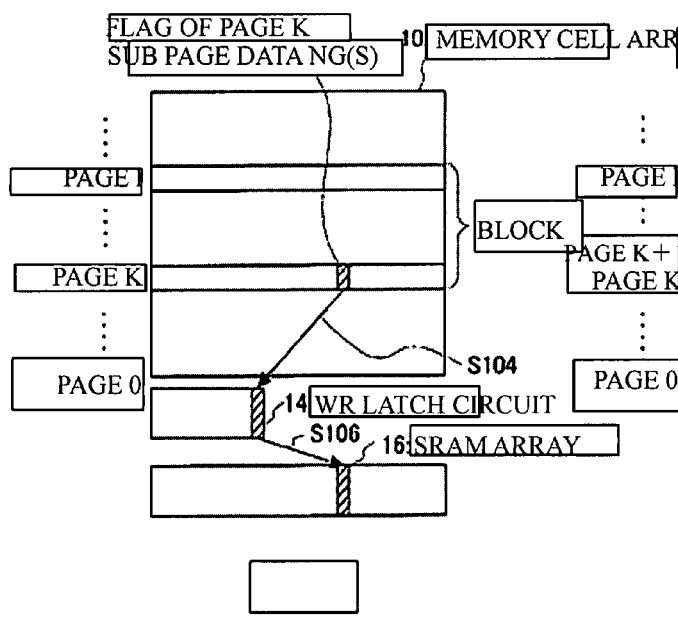
FIGS. 25A through 25D show the flow of data in a case where the data is read from the memory cell array in accordance with the fourth embodiment of the present invention.

An operation to be performed by the control circuit 34 of the fourth embodiment is now described. FIG. 24 is a flowchart of the operation to be performed by the control circuit 34 in accordance with the fourth embodiment of the invention. Like FIGS. 23A through 23D, FIGS. 25A through 25D show the flow of data in a case where data is read out in the copy back mode according to an embodiment of the invention. Referring to FIG. 24, the control circuit 34 first determines whether the operating mode is the copy back mode (step S100). If the operating mode is not the copy back mode, the control circuit 34 ends the operation. If the operating mode is the copy back mode, the control circuit 34 obtains the address of the block to be copied back, and the address of the flag that stores the flag data in the spare area (step S102). As shown in FIGS. 24 and 25A, sub page data nG (s) that is the flag data of the page k is stored into the WR latch circuit 14 (step S104). The flag data of the page k is then transferred from the WR latch circuit 14 and is stored into the SRAM array 16 (step S106).

Figure 25B:
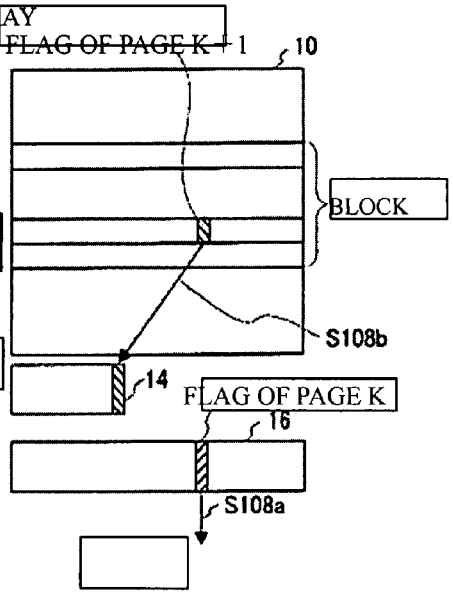
Figure 25C:
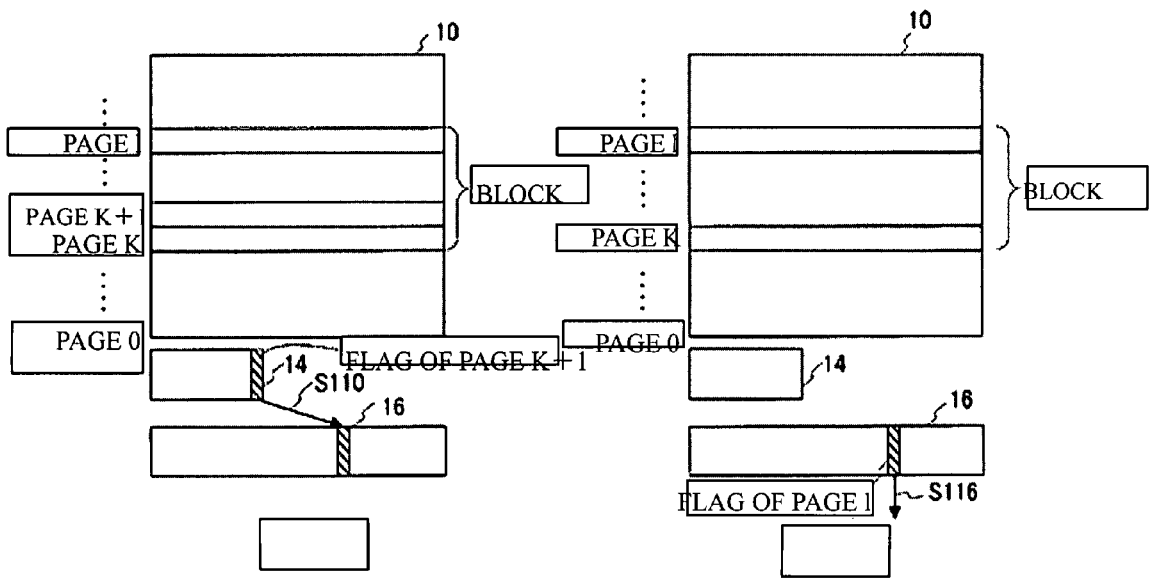

As shown in FIG. 24 and FIG. 25B, the flag data of the page k stored in the SRAM array 16 is output to the outside (step S108a). During that time, the flag data of the page k+1 that is the next page is transferred from the memory cell array 10 and is stored into the WR latch circuit 14 (step S108b). As shown in FIG. 24 and FIG. 25C, the flag data of the page k+1 is then transferred from the WR latch circuit 14 and is stored into the SRAM array 16 (step S110). As shown in FIG. 24, the control circuit 34 determines whether the flag data of the page k+1 is the flag data of the last page (step S112). If the page k+1 is not the last page, the page address is incremented (step S114), and the operation moves on to step S108. In this manner, the flag data of the page k through the page 1 in the block are successively output.

Figure 25D:
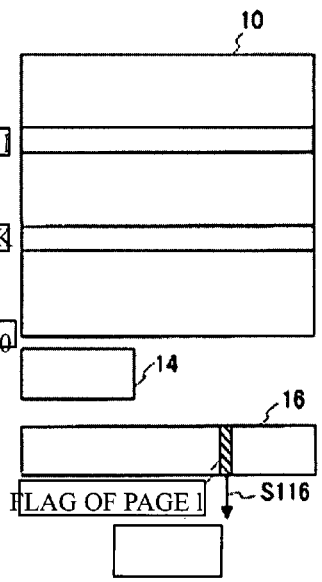

If the current page is determined to be the last page 1 in step S112, the operation moves on to step S116. As shown in FIGS. 24 and 25D, the flag data of the page 1 that is the last page stored in the SRAM array 16 is output from the SRAM array 16 to the outside.

In the above manner, the flag data of the page k through the page 1 in the memory cell array 10 are output to the outside. The copy back operation is performed by transferring page data determined to be valid by an external circuit from the WR latch circuit 14 and storing the page data into the SRAM array 16 in the primary reading mode of the first embodiment or in the same manner as in the second embodiment, and then copying the page data into the page that is the copy back destination. Thus, the operation of the control circuit 34 is completed.

In the fourth embodiment, as shown in FIG. 24 and FIG. 25B, while outputting the sub page data nG (s) (the first divisional spare data) containing the flag data indicating the validity of the page k to the outside, the control circuit 34 stores the sub page data (the second divisional spare data) containing the flag data of another page k+1 into the WR latch circuit 14. As the divisional spare data contains the flag data, the flag data in the block can be output to the outside at a high speed. Also, only the spare data containing the flag data is output to the outside, which is not the case in the third embodiment. Accordingly, data output can be performed at a higher speed.

Although the first through fourth embodiments relate to virtual-ground flash memories, the present invention may also be applied to SONOS flash memories, floating-gate flash memories, and other non-volatile memories. Also, each one page contains 2 Kbytes, each one piece of divisional data contains 64 bits, and each one piece of divisional spare data contains 16 bits in the above embodiment. However, data lengths are not limited to the above examples. The outside (or an external circuit) may be either an operational circuit such as the CPU in a semiconductor device that contains the flash memory of one of the first through fourth embodiments, or an operational circuit such as a CPU outside the semiconductor device containing the flash memory. Although the preferred embodiments of the present invention have been described so far, the present invention is not limited to those specific embodiments, and various changes and modifications may be made to them within the scope of the present invention.

Embodiments generally relate to semiconductor devices. In one implementation, the various embodiments are applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive navigation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones, etc.).

Flash memory stores information in an array of floating gate transistors, called "cells", each of which traditionally stores one bit of information. However, newer flash memory devices can store more than 1 bit per cell, doubling the intrinsic density of a Flash memory array by storing two physically distinct bits on opposite sides of a memory cell. Each bit serves as a binary bit of data (e.g., either 1 or 0) that is mapped directly to the memory array. Reading or programming one side of a memory cell occurs independently of whatever data is stored on the opposite side of the cell.

With regards to wireless markets, flash memory that utilizes the newer technology has several key advantages, such as being capable of burst-mode access as fast as 80 MHz, page access times as fast as 25 ns, simultaneous read-write operation for combined code and data storage, and low standby power (e.g., 1 µA).

Figure 26:
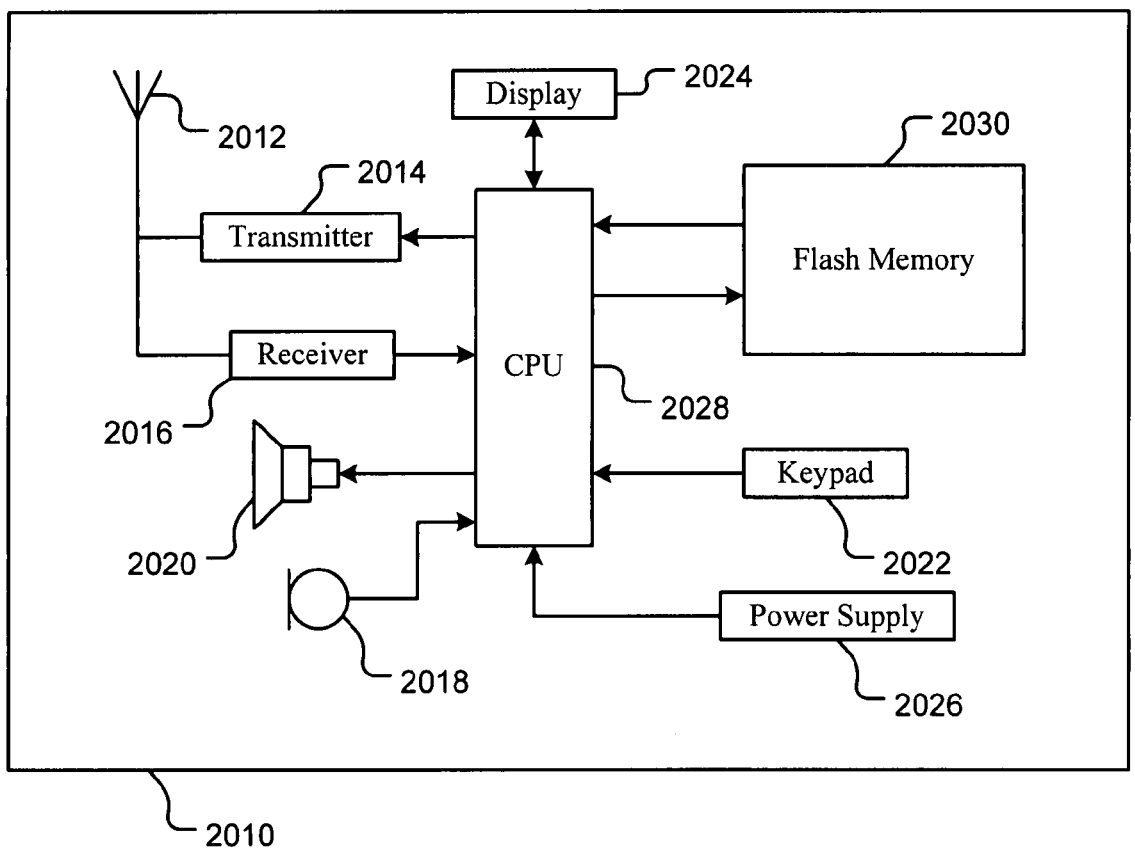
FIG. 26 illustrates a block diagram of a conventional portable phone, upon which embodiments may be implemented.

FIG. 26 shows a block diagram of a conventional portable telephone 2010 (e.g., cell phone, cellular phone, mobile phone, internet protocol phone, wireless phone, etc.), upon which embodiments can be implemented. The cell phone 2010 includes an antenna 2012 coupled to a transmitter 2014 and a receiver 2016, as well as a microphone 2018, a speaker 2020, a keypad 2022, and a display 2024. The cell phone 2010 also includes a power supply 2026 and a central processing unit (CPU) 2028, which may be an embedded controller, conventional microprocessor, or the like. In addition, the cell phone 2010 includes integrated, flash memory 2030. Flash memory 2030 includes a memory cell array that includes non-volatile memory cells; a first storage unit; and a control circuit that selects between a primary reading mode for causing the first storage unit to hold the area data transferred from the memory cell array and to output the area data to the outside, and a secondary reading mode for causing the first storage unit to hold plural pieces of divisional data formed by dividing the area data and transferred from the memory cell array and to output the divisional data to the outside. According to various embodiments it is possible to provide a semiconductor device, such as flash memory, that can be configured to process data at adjustable speeds depending on the amount of data to be processed. The present invention also provides a method of controlling such a semiconductor device. As a result, the flash memory 2030 is more efficient. This increased efficiency for the flash memory translates into increased speed for various devices, such as mobile phones, cellular phones, internet protocol phones, and/or wireless phones.

Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are coupled to the bit lines in a parallel configuration, while in a conventional NAND-type flash memory, the memory cell transistors are coupled to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps.), flash memory requirements have steadily increased. Thus, a less expensive flash memory will render a portable phone more competitive in the telecommunications market.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

Figure 27:
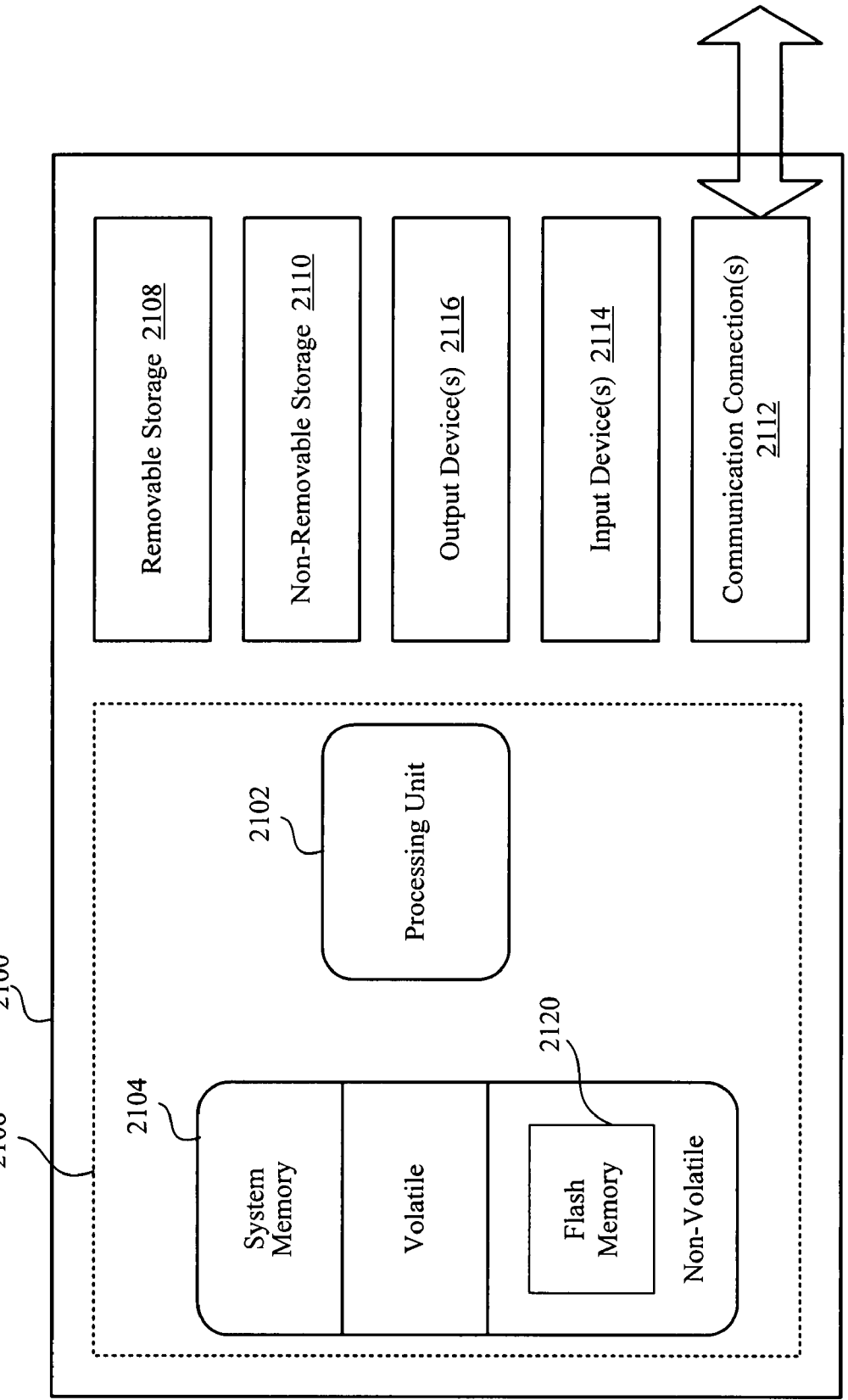
FIG. 27 illustrates a block diagram of a computing device, upon which embodiments may be implemented.

FIG. 27 illustrates a block diagram of a computing device 2100, upon which embodiments of the present claimed subject matter can be implemented. Although computing device 2100 is shown and described in FIG. 27 as having certain numbers and types of elements, the embodiments are not necessarily limited to the exemplary implementation. That is, computing device 2100 can include elements other than those shown, and can include more than one of the elements that are shown. For example, computing device 2100 can include a greater number of processing units than the one (processing unit 2102) shown. Similarly, in another example, computing device 2100 can include additional components not shown in FIG. 27.

Also, it is appreciated that the computing device 2100 can be a variety of things. For example, computing device 2100 may be, but is not limited to, a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounter frequent physical impacts. Also, flash memory is more able than other types of memory to withstand intense physical pressure and/or heat. Thus, portable computing devices are able to be used in a greater range of environmental variables.

In its most basic configuration, computing device 2100 typically includes at least one processing unit 2102 and memory 2104. Depending on the exact configuration and type of computing device, memory 2104 may be volatile (such as RAM), non-volatile (such as ROM, flash memory, etc.) or some combination of the two. This most basic configuration of computing device 2100 is illustrated in FIG. 11 by line 2106. Additionally, device 2100 may also have additional features/functionality. For example, device 2100 may also include additional storage (removable and/or non-removable) including, but not limited to, magnetic or optical disks or tape.

In one example, in the context of a gaming system, the removable storage could be a game cartridge receiving component utilized to receive different game cartridges. In another example, in the context of a Digital Versatile Disc (DVD) recorder, the removable storage is a DVD receiving component utilized to receive and read DVDs. Such additional storage is illustrated in FIG. 27 by removable storage 2108 and non-removable storage 2110. Computer storage media includes volatile and nonvolatile, removable and non-removable media implemented in any method or technology for storage of information such as computer readable instructions, data structures, program modules or other data. Memory 2104, removable storage 2108 and non-removable storage 2110 are all examples of computer storage media. Computer storage media includes, but is not limited to, RAM, ROM, EEPROM, flash memory 2120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2100. Any such computer storage media may be part of device 2100.

In the present embodiment, the flash memory 2120 comprises a memory cell array that includes non-volatile memory cells; a first storage unit; and a control circuit that selects between a primary reading mode for causing the first storage unit to hold the area data transferred from the memory cell array and to output the area data to the outside, and a secondary reading mode for causing the first storage unit to hold plural pieces of divisional data formed by dividing the area data and transferred from the memory cell array and to output the divisional data to the outside. According to various embodiments it is possible to provide a semiconductor device, such as flash memory, that can be configured to process data at adjustable speeds depending on the amount of data to be processed. The present invention also provides a method of controlling such a semiconductor device. As a result, the flash memory 2120 is more efficient. This increased efficiency for the flash memory translates into increased speed for various devices, personal digital assistants, set-top boxes, digital video recorders, networking and telecommunication equipments, printers, computer peripherals, automotive navigation devices, gaming systems, mobile phones, cellular phones, internet protocol phones, and/or wireless phones. Further, in one embodiment, the flash memory 2120 utilizes said newer technology to allow storing of two physically distinct bits on opposite sides of a memory cell.

Device 2100 may also contain communications connection(s) 2112 that allow the device to communicate with other devices. Communications connection(s) 2112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. The term computer readable media as used herein includes both storage media and communication media.

Device 2100 may also have input device(s) 2114 such as keyboard, mouse, pen, voice input device, game input device (e.g., a joy stick, a game control pad, and/or other types of game input device), touch input device, etc. Output device(s) 2116 such as a display (e.g., a computer monitor and/or a projection system), speakers, printer, network peripherals, etc., may also be included. All these devices are well known in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous. Users would also benefit from reduced memory read time and reduced cost.

Figure 28:
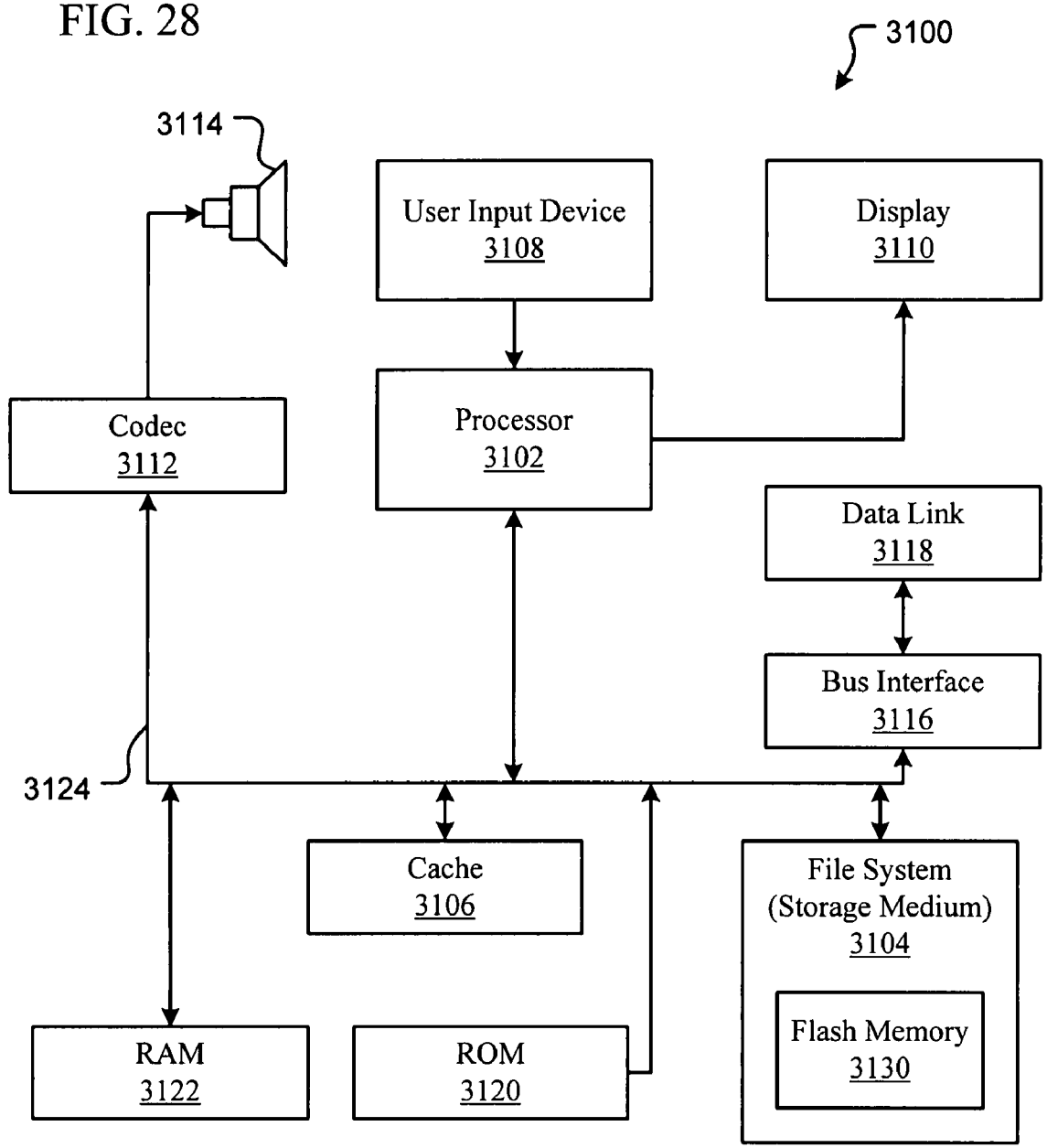
FIG. 28 illustrates an exemplary portable multimedia device, or media player, in accordance with various embodiments of the present invention.

FIG. 28 shows an exemplary portable multimedia device, or media player, 3100 in accordance with an embodiment of the invention. The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage medium or a plurality of storage media, such as disks, memory cells, and the like. The file system 3104 typically provides high capacity storage capability for the media player 3100. Also, file system 3104 includes flash memory 3130. In the present embodiment, the flash memory 3130 includes a memory cell array that includes non-volatile memory cells; a first storage unit; and a control circuit that selects between a primary reading mode for causing the first storage unit to hold the area data transferred from the memory cell array and to output the area data to the outside, and a secondary reading mode for causing the first storage unit to hold plural pieces of divisional data formed by dividing the area data and transferred from the memory cell array and to output the divisional data to the outside. According to various embodiments it is possible to provide a semiconductor device, such as flash memory, that can be configured to process data at adjustable speeds depending on the amount of data to be processed. The present invention also provides a method of controlling such a semiconductor device. As a result, the flash memory 3130 is more efficient. This increased efficiency for the flash memory translates into increased speed for various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3122 and a Read-Only Memory (ROM) 3120. The ROM 3120 can store programs, utilities or processes to be executed in a non-volatile manner. The RAM 3122 provides volatile data storage, such as for the cache 3106.

The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3112. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs, photos, video, etc.) in the file system 3104. When a user desires to have the media player play/display a particular media item, a list of available media assets is displayed on the display 3110. Then, using the user input device 3108, a user can select one of the available media assets. The processor 3102, upon receiving a selection of a particular media item, supplies the media data (e.g., audio file, graphic file, video file, etc.) for the particular media item to a coder/decoder (CODEC) 3110. The CODEC 3110 then produces analog output signals for a speaker 3114 or a display 3110. The speaker 3114 can be a speaker internal to the media player 3100 or external to the media player 3100. For example, headphones or earphones that couple to the media player 3100 would be considered an external speaker.

In a particular embodiment, the available media assets are arranged in a hierarchical manner based upon a selected number and type of groupings appropriate to the available media assets. For example, in the case where the media player 3100 is an MP3-type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

Finally, some aspects of the present invention are summarized as follows. In the above-described semiconductor device, in the secondary reading mode, while causing the first storage unit to output first divisional data that is one piece of the plural pieces of divisional data to the outside, the control circuit may cause the first storage unit to hold second divisional data that is the next piece of divisional data among the plural pieces of divisional data and may be transferred from the memory cell array. The time required for outputting data from the non-volatile memory in the secondary reading mode can be shortened.

In the above-described semiconductor device, a time required for transferring the divisional data from the memory cell array to the first storage unit in the secondary reading mode may be shorter than a time required for transferring the area data from the memory cell array to the first storage unit in the primary reading mode. The time required for outputting data from the non-volatile memory in the secondary reading mode can be shortened.

The above-described semiconductor device may further include a high-voltage generating circuit that generates voltages to be applied to the memory cell array when the data is read from the memory cell array, and the high-voltage generating circuit may generate a higher voltage in the secondary reading mode than in the primary reading mode. The time required for transferring data from the memory cell array to the first storage unit in the secondary reading mode can be shortened. Accordingly, the time required for outputting data from the non-volatile memory can be made even shorter.

The above-described semiconductor device may further include a read circuit that reads the data from the memory cell array, and the read circuit may read the data from the memory cell array with larger power consumption in the secondary reading mode than in the primary reading mode. The time required for transferring data from the memory cell array to the first storage unit in the secondary reading mode can be shortened. Accordingly, the time required for outputting data from the non-volatile memory can be made even shorter.

The above-described semiconductor device may further include: a bit line that is coupled to a memory cell from which the data is read out; and a transistor that controls a current to be supplied to the bit line when the data is read from the memory cell, and the transistor may supply a higher current to the bit line in the secondary reading mode than in the primary reading mode. The bit lines can be pre-charged at a high speed in the secondary reading mode, and the time required for transferring data from the memory cell array to the first storage unit in the secondary reading mode can be shortened. Accordingly, the time required for outputting data from the non-volatile memory can be made even shorter.

The above-described semiconductor device may further include: a bit line that is coupled to a memory cell from which the data is read out; and a first comparator circuit that compares a voltage of the bit line with a reference voltage, and a current source transistor provided for the first comparator circuit supplies a higher current to the first comparator circuit in the secondary reading mode than in the primary reading mode. The bit lines can be pre-charged to the reference voltage at a high speed in the secondary reading mode, and the time required for transferring data from the memory cell array to the first storage unit in the secondary reading mode can be shortened. Accordingly, the time required for outputting data from the non-volatile memory can be made even shorter.

The above-described semiconductor device may further include a second comparator circuit that compares a signal representing a current flowing through a memory cell from which the data is read out with a signal representing a current flowing through a reference cell, and a current source transistor provided for the second comparator circuit may supply a higher current to the second comparator circuit in the secondary reading mode than in the primary reading mode. The current flowing through a memory cell can be compared with the current flowing through the reference cell at a high speed in the secondary reading mode, and the time required for transferring data from the memory cell array to the first storage unit in the secondary reading mode can be shortened. Accordingly, the time required for outputting data from the non-volatile memory can be made even shorter.

The above-described semiconductor device may further include a second storage unit that holds the area data stored in the first storage unit, and later outputs the area data to the outside.

The above-described semiconductor device may further include a switch that transfers the area data from the first storage unit to the second storage unit in the primary reading mode, and outputs the divisional data from the first storage unit to the outside without the use of the second storage unit in the secondary reading mode. In the secondary reading mode, it is not necessary to output data via the second storage unit, and data can be output at a higher speed.

The above-described semiconductor device may further include a switch that transfers the area data from the first storage unit to the second storage unit in the primary reading mode, and outputs the divisional data from the first storage unit to the outside without the use of the second storage unit and transfers the area data to the second storage unit in the secondary reading mode. In the secondary reading mode, it is not necessary to output data via the second storage unit, and data can be output at a higher speed. Furthermore, when the data is again output to the outside, the data is output via the second storage unit, and secondary data output can be performed.

In the above-described semiconductor device, a time required for transferring the first divisional data from the memory cell array to the first storage unit may be shorter than a time required for transferring the second divisional data from the memory cell array to the first storage unit. The power consumption in the secondary reading mode can be reduced.

In the above-described semiconductor device, the semiconductor device may be capable of performing a copy back operation to write the area data into another area, after storing the area data in the first or second storage unit; the area may include a spare area for storing spare data that contains flag data indicating validity of the area data; and the control circuit may cause a part of the spare data containing the flag data to be output to the outside. The flag data is output to the outside, so that the validity of the area data can be determined outside.

In the above-described semiconductor device, the semiconductor device may be capable of performing a copy back operation to write the area data into another area, after storing the area data in the first or second storage unit; the area includes a spare area for storing spare data that contains flag data indicating validity of the area data; and in the copy back operation, while causing the first storage unit to output first divisional spare data that is the first piece of divisional spare data formed by dividing the spare data to the outside, the control circuit may cause the first storage unit to hold second divisional spare data that is the next divisional spare data transferred from the memory cell array. The time required for outputting the spare data in the copy back mode can be shortened. Accordingly, the flag data can be output at a high speed.

In the above-described semiconductor device, while causing the first storage unit to output the last divisional spare data among the plural pieces of divisional spare data, the control circuit may cause the first storage unit to hold the first divisional data of the area data transferred from the memory cell array. The time required for outputting the spare data can be made even shorter.

In the above-described semiconductor device, the semiconductor device may be capable of performing a copy back operation to write the area data into another area, after storing the area data in the first or second storage unit; the area includes a spare area for storing spare data that contains flag data indicating validity of the area data; and in the copy back operation, while causing the first storage unit to output first divisional spare data that is the first piece of divisional spare data formed by dividing the spare data to the outside, the control circuit may cause the first storage unit to hold second divisional spare data that is divisional spare data of another area, the second divisional spare data being transferred from the memory cell array. The time required for outputting the spare data can be shortened also in a case where plural pieces of spare data are successively output.

In the above-described semiconductor device, the semiconductor device may be capable of performing a copy back operation to write the area data into another area, after storing the area data in the first or second storage unit; the area may include a spare area for storing spare data that contains flag data indicating validity of the area data; and in the copy back operation, while causing the first storage unit to output first divisional spare data containing the flag data among plural pieces of divisional spare data formed by dividing the spare data of the area to the outside, the control circuit may cause the first storage unit to hold second divisional spare data containing the flag data among plural pieces of divisional spare data formed by dividing the spare data of another area, the second divisional spare data being transferred from the memory cell array. Only the data containing the flag data among the spare data is output to the outside. Accordingly, secondary data output can be performed.

In the above-described semiconductor device, the non-volatile memory cells may include virtual-ground memory cells. Virtual-ground memory cells are employed, so that the secondary reading mode for processing data at a high speed and the primary reading mode for processing a large amount of data with smaller power consumption can be selected in one non-volatile memory.

According to a second aspect of the present invention, there is provided a method of controlling a semiconductor device that has a memory cell array including non-volatile memory cells, an area that is in the memory cell array and stores area data, and a first storage unit that holds data transferred from the memory cell array and later outputs the data to an outside, the method including: a primary reading operation that includes storing the area data transferred from the memory cell array into the first storage unit, and outputting the area data from the first storage unit to the outside; a secondary reading operation that includes storing plural pieces of divisional data formed by dividing the area data and transferred from the memory cell array into the first storage unit, and outputting the divisional data from the first storage unit to the outside; and selecting between a primary reading mode and a secondary reading mode. The secondary reading mode for processing data at a high speed and the primary reading mode for processing a large amount of data with smaller power consumption can be selected in one non-volatile memory.

In the above-described method, storing the plural pieces of divisional data may include: outputting first divisional data from the first storage unit to the outside, the first divisional data being one of the plural pieces of divisional data; and storing second divisional data transferred from the memory cell array into the first storage unit, the second divisional data being the next one of the plural pieces of divisional data; and storing the second divisional data is carried out while outputting the first divisional data is being carried out. The time required for outputting data from the non-volatile memory in the secondary reading mode can be shortened.

The above-described method may further include a copy back operation that includes storing the area data into the first storage unit and writing the area data into another area, and the region may include a spare area that stores spare data that contains flag data indicating validity of the area data; and the copy back operation may include outputting first divisional spare data that is one of plural pieces of divisional data formed by dividing the spare data from the first storage unit to the outside, and storing second divisional spare data that is the next one of the plural pieces of divisional data into the first storage unit, the second divisional spare data being transferred from the memory cell array; and storing the second divisional spare data may be carried out while outputting the first divisional spare data is being carried out. The time required for outputting the spare data in the copy back mode can be shortened.

As described above, the present invention can provide a semiconductor device capable of selecting between secondary data processing and mass data processing with smaller power consumption, and a method of controlling such a semiconductor device.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A semiconductor device comprising:
    a memory cell array comprising a plurality of non-volatile memory cells;
    a read circuit that transfers the data from the memory cell array;
    a storage unit that stores data transferred from the memory cell array; and
    a control circuit that selects between:
        a primary reading mode configured to store the data transferred from the memory cell array into the first storage unit and to output the data; and
        a secondary reading mode configured to store a plurality of pieces of divisional data in the first storage unit, the plurality of pieces of divisional data being formed by dividing the data transferred from the memory cell array and outputting the divisional data.

2. The semiconductor device as claimed in claim 1, wherein, in the secondary reading mode, while the first storage unit outputs a first divisional data of the plurality of pieces of divisional data, a second divisional data that comprises the next piece of divisional data among the plurality of pieces of divisional data is transferred from the memory cell array and stored in the first storage unit.

3. The semiconductor device as claimed in claim 2, wherein a time required for transferring the first divisional data from the memory cell array to the first storage unit is shorter than a time required for transferring the second divisional data from the memory cell array to the first storage unit.

4. The semiconductor device as claimed in claim 1, wherein a time required for transferring the divisional data from the memory cell array to the first storage unit in the secondary reading mode is shorter than a time required for transferring the area data from the memory cell array to the first storage unit in the primary reading mode.

5. The semiconductor device as claimed in claim 1, further comprising:
    a high-voltage generating circuit that generates voltages to be applied to the memory cell array when the data is read from the memory cell array,
    wherein the high-voltage generating circuit generates a higher voltage in the secondary reading mode than in the primary reading mode.

6. The semiconductor device as claimed in claim 1,
    wherein the read circuit reads the data from the memory cell array with a higher rate of power consumption in the secondary reading mode than in the primary reading mode.

7. The semiconductor device as claimed in claim 1, further comprising:
    a bit line coupled to a memory cell from which the data is read out; and
    a transistor that controls a current to be supplied to the bit line when the data is read from the memory cell,
    wherein the transistor supplies a higher current to the bit line in the secondary reading mode than in the primary reading mode.

8. The semiconductor device as claimed in claim 1, further comprising:
    a bit line coupled to a memory cell from which the data is read out; and
    a first comparator circuit configured to compare a voltage of the bit line with a reference voltage, wherein a current source transistor provided for the first comparator circuit supplies a higher current to the first comparator circuit in the secondary reading mode than in the primary reading mode.

9. The semiconductor device as claimed in claim 1, further comprising:
a second comparator circuit configured to compare a signal representing a current flowing through a memory cell from which the data is read out with a signal representing a current flowing through a reference cell,
wherein a current source transistor provided for the second comparator circuit supplies a higher current to the second comparator circuit in the secondary reading mode than in the primary reading mode.

10. The semiconductor device as claimed in claim 1, further comprising:
a second storage unit configured to hold the area data stored in the first storage unit, and later outputs the area data to the outside.

11. The semiconductor device as claimed in claim 10, further comprising:
a switch configured to transfer the area data from the first storage unit to the second storage unit in the primary reading mode, and output the divisional data from the first storage unit to the outside without the use of the second storage unit and transfers the area data to the second storage unit in the secondary reading mode.

12. The semiconductor device as claimed in claim 10, wherein:
the semiconductor device is configured to perform a copy back operation to write the area data into another area, after storing the area data in the second storage unit;
the area includes a spare area configured to store spare data that contains flag data indicating validity of the area data; and
the control circuit is configured to output a part of the spare data containing the flag data to the outside.

13. The semiconductor device as claimed in claim 1, wherein:
the semiconductor device is configured to perform a copy back operation to write the area data into another area, after storing the area data in the first storage unit;
the area includes a spare area configured to store spare data that contains flag data indicating validity of the area data; and
the control circuit is configured to output a part of the spare data containing the flag data to the outside.

14. A method of controlling a semiconductor device that has a memory cell array including non-volatile memory cells, a read circuit that transfers data from the memory cell array, an area comprised in the memory cell array and stores area data, and a first storage unit that holds data transferred from the memory cell array and later outputs the data to an outside, the method comprising:
a primary reading operation that includes storing the area data transferred from the memory cell array by the read circuit into the first storage unit, and outputting the area data from the first storage unit to the outside;
a secondary reading operation that includes storing a plurality of pieces of divisional data formed by dividing the area data and transferred from the memory cell array into the first storage unit, and outputting the divisional data from the first storage unit to the outside; and
selecting between a primary reading mode and a secondary reading mode.

15. The method as claimed in claim 14, wherein:
storing the plurality of pieces of divisional data includes:
outputting first divisional data from the first storage unit to the outside, the first divisional data being one of the plurality of pieces of divisional data; and
storing second divisional data transferred from the memory cell array into the first storage unit, the second divisional data being the next one of the plurality of pieces of divisional data;
wherein storing the second divisional data is carried out while outputting the first divisional data is being carried out.

16. The method as claimed in claim 14, further comprising:
a copy back operation that includes storing the area data into the first storage unit and writing the area data into another area,
wherein the region includes a spare area that stores spare data that contains flag data indicating validity of the area data; and
the copy back operation includes outputting first divisional spare data that is one of the plurality of pieces of divisional data formed by dividing the spare data from the first storage unit to the outside, and storing second divisional spare data that is the next one of the plurality of pieces of divisional data into the first storage unit, the second divisional spare data being transferred from the memory cell array; and
storing the second divisional spare data is carried out while outputting the first divisional spare data is being carried out.

17. A system, comprising:
a processor;
a cache;
a user input component; and
a flash memory having at least one memory cell, the memory cell comprising:
nonvolatile memory;
a read circuit that transfers data from the memory cell;
an area in the memory cell array that stores area data;
one or more storage units with output to an outside; and
a control circuit that selects between varying modes of data.

18. The system as recited in claim 17 wherein the system is a portable media player.

19. The system as recited in claim 17 wherein the system is a cellular telephone.

20. The system as recited in claim 17 wherein the system is a computing device.

21. A system, comprising:
a processor;
a cache;
a user input component; and
a flash memory having a memory cell array, the memory cell array comprising a plurality of nonvolatile memory cells;
a read circuit that transfers the data from the memory cell array;
one or more storage units that stores area data transferred from the memory cell array; with output to an outside; and
a control circuit that selects between:
a primary reading mode configured to store the data transferred from the memory cell array into the first storage unit and to output the data; and
a secondary reading mode configured to store a plurality of pieces of divisional data in the first storage unit, the plurality of pieces of divisional data being formed by dividing the data transferred from the memory cell array and outputting the divisional data.

22. The system as recited in claim 17 wherein the system is a portable media player.

23. The system as recited in claim 17 wherein the system is a cellular telephone.

24. The system as recited in claim 17 wherein the system is a computing device.

* * * * *